(12) United States Patent
Kim et al.

(10) Patent No.: US 12,082,416 B2
(45) Date of Patent: Sep. 3, 2024

(54) INTEGRATED ASSEMBLIES AND METHODS OF FORMING INTEGRATED ASSEMBLIES

(71) Applicant: Micron Technology, Inc., Boise, ID (US)

(72) Inventors: Byeung Chul Kim, Boise, ID (US); Davide Resnati, Vimercate (IT); Gianpietro Carnevale, Bottanuco (IT); Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 17/389,864

(22) Filed: Jul. 30, 2021

(65) Prior Publication Data

US 2023/0034157 A1 Feb. 2, 2023

(51) Int. Cl.
*H10B 43/27* (2023.01)

(52) U.S. Cl.
CPC .................. *H10B 43/27* (2023.02)

(58) Field of Classification Search
CPC ............ H10L 27/11582; H01L 28/87–94
See application file for complete search history.

(56) References Cited

U.S. PATENT DOCUMENTS

| | | | |
|---|---|---|---|
| 10,593,695 B1* | 3/2020 | Kim | H01L 29/40114 |
| 2021/0057436 A1* | 2/2021 | Kim | G11C 16/08 |
| 2021/0143171 A1* | 5/2021 | Kim | H10B 43/27 |
| 2022/0285386 A1* | 9/2022 | Said | H10B 41/10 |

\* cited by examiner

*Primary Examiner* — Vu A Vu
*Assistant Examiner* — Valerie N Newton
(74) *Attorney, Agent, or Firm* — Wells St. John P.S.

(57) ABSTRACT

Some embodiments include an integrated assembly having a stack of alternating insulative levels and conductive levels. A pillar of channel material extends through the stack. The conductive levels have terminal regions adjacent the pillar. Charge-storage-material-segments are adjacent the conductive levels of the stack, and are between the channel material and the terminal regions. Tunneling material is between the charge-storage-material-segments and the channel material. Charge-blocking-material is between the charge-storage-material-segments and the terminal regions. Ribbons of dielectric material extend vertically across the insulative levels and are laterally inset relative to the terminal regions. The ribbons have first regions adjacent the conductive levels and have second regions between the first regions, with the second regions being laterally inset relative to the first regions. Some embodiments include methods of forming integrated assemblies.

47 Claims, 28 Drawing Sheets

INTEGRATED ASSEMBLIES AND METHODS OF FORMING INTEGRATED ASSEMBLIES

TECHNICAL FIELD

Integrated assemblies (e.g., memory devices) and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Operation of memory cells may comprise movement of charge between a channel material and a charge-storage material. For instance, programming of a memory cell may comprise moving charge (i.e., electrons) from the channel material into the charge-storage material, and then storing the charge within the charge-storage material. Erasing of the memory cell may comprise moving holes into the charge-storage material to recombine with the electrons stored in the charge-storage material, and to thereby release charge from the charge-storage material. The charge-storage material may comprise charge-trapping material (for instance, silicon nitride, metal nanodots, etc.). A problem with conventional memory can be that charge-trapping material extends across multiple memory cells of a memory array, and such can lead to charge migration from one memory cell to another. The charge migration may lead to data retention problems. Some embodiments include memory devices (e.g., NAND architectures) having breaks in the charge-trapping material in regions between memory cells, and such breaks may advantageously impede migration of charge between memory cells.

Another problem which may be encountered with conventional memory cells is that control gates may be too narrow to achieve desired rapid programming and erase of memory cells. Some embodiments include memory devices with relative wide control gates which are tailored to provide wider program/erase windows than are generally available with conventional architectures. The wide control gates may be formed in combination with narrow routing structures (wordlines) which are tailored to reduce undesired parasitic capacitance between vertically-stacked routing structures. Example embodiments are described with reference to FIGS. 5-16.

Figure 1:
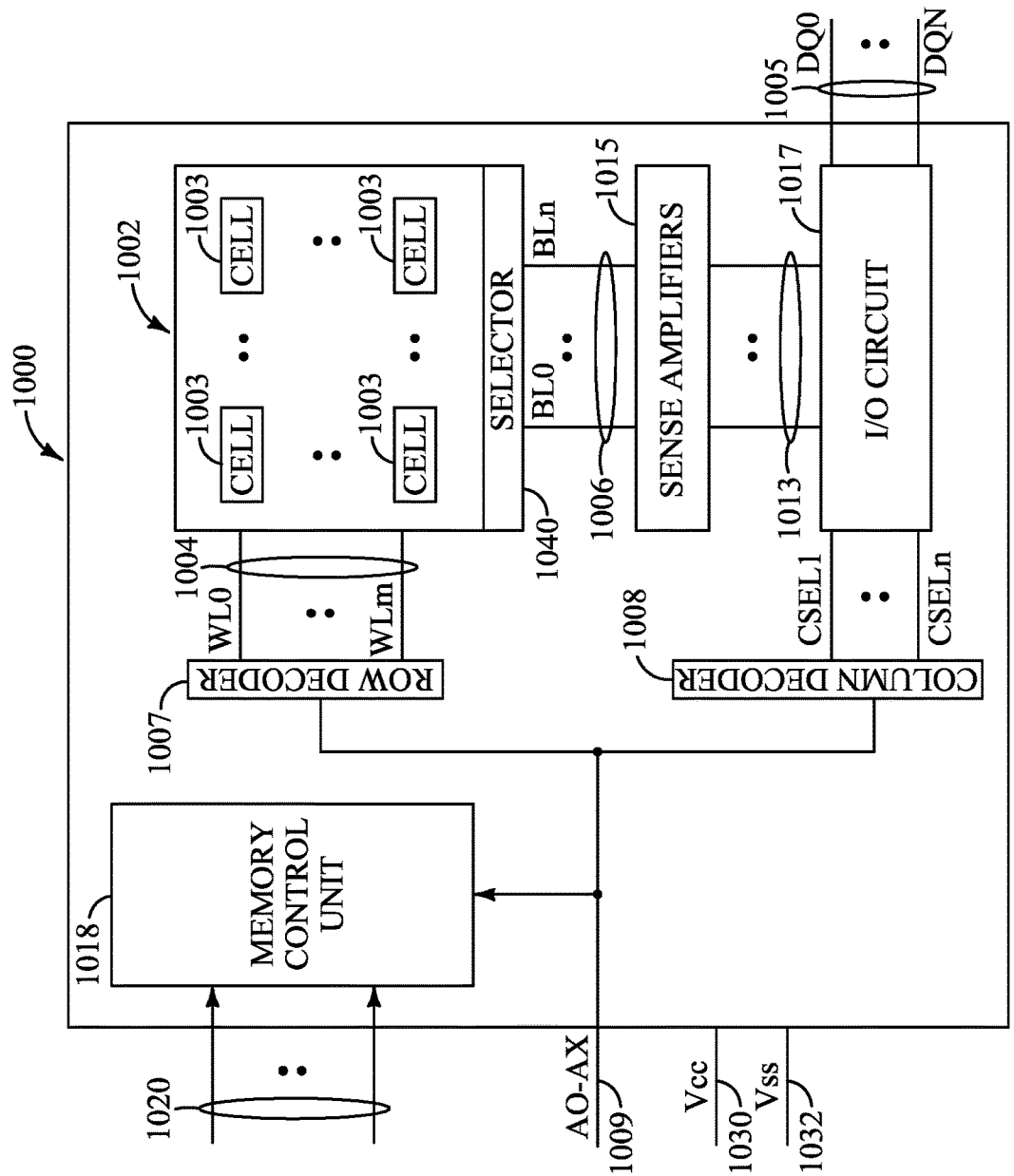
FIG. 1 shows a block diagram of a prior art memory device having a memory array with memory cells.
Figure 2:
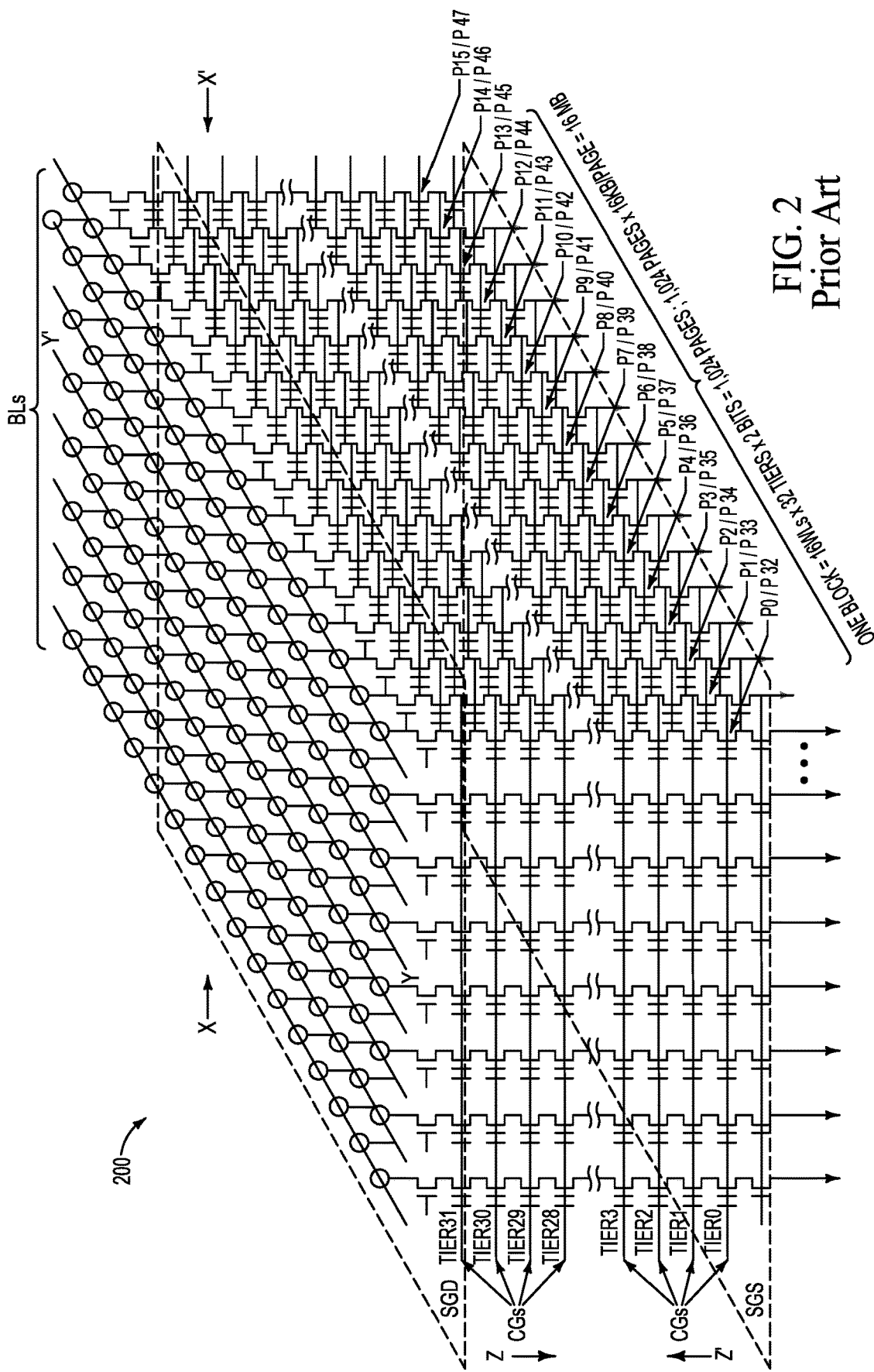
FIG. 2 shows a schematic diagram of the prior art memory array of FIG. 1 in the form of a 3D NAND memory device.
Figure 3:
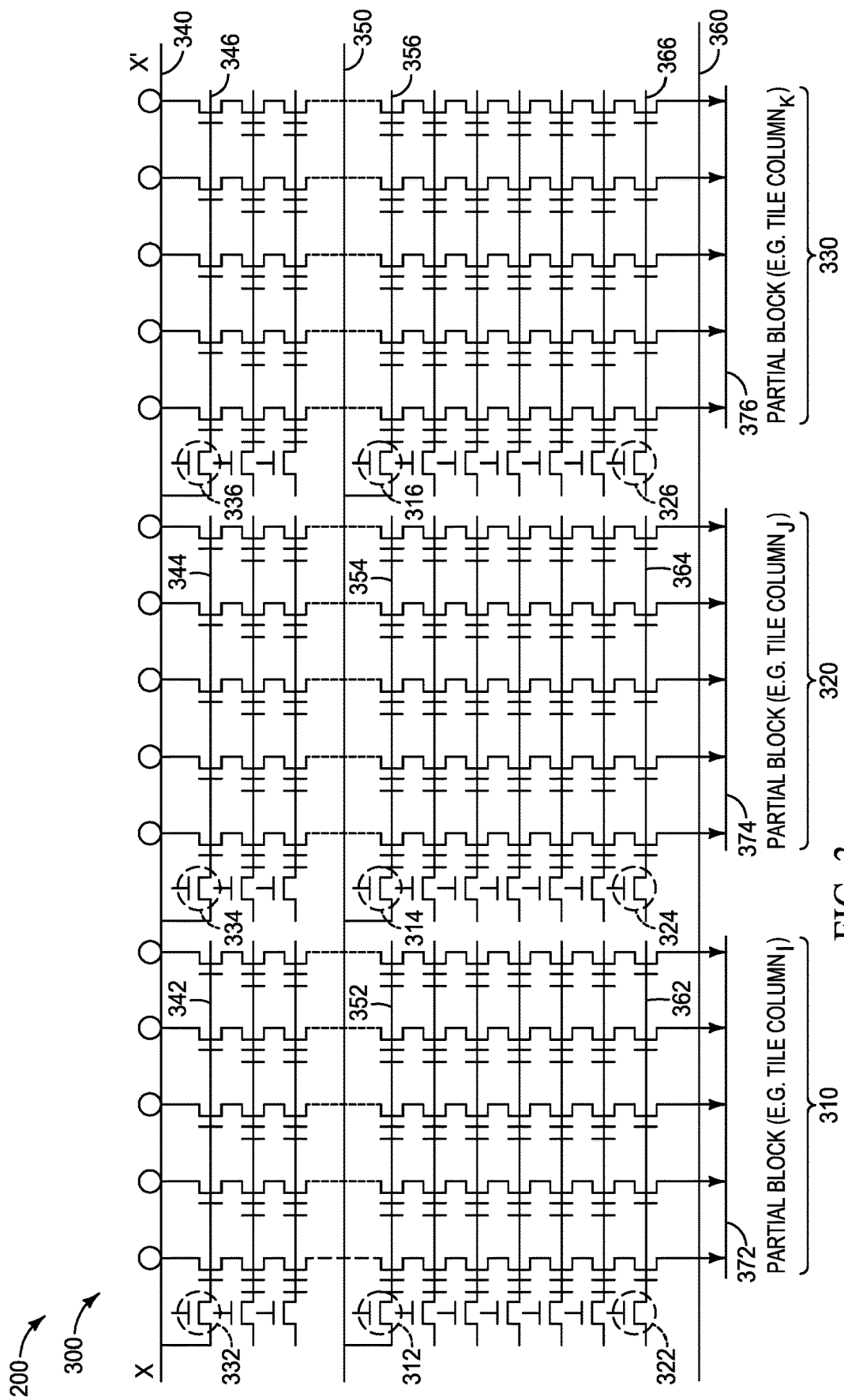
FIG. 3 shows a cross-sectional view of the prior art 3D NAND memory device of FIG. 2 in an X-X' direction.
Figure 4:
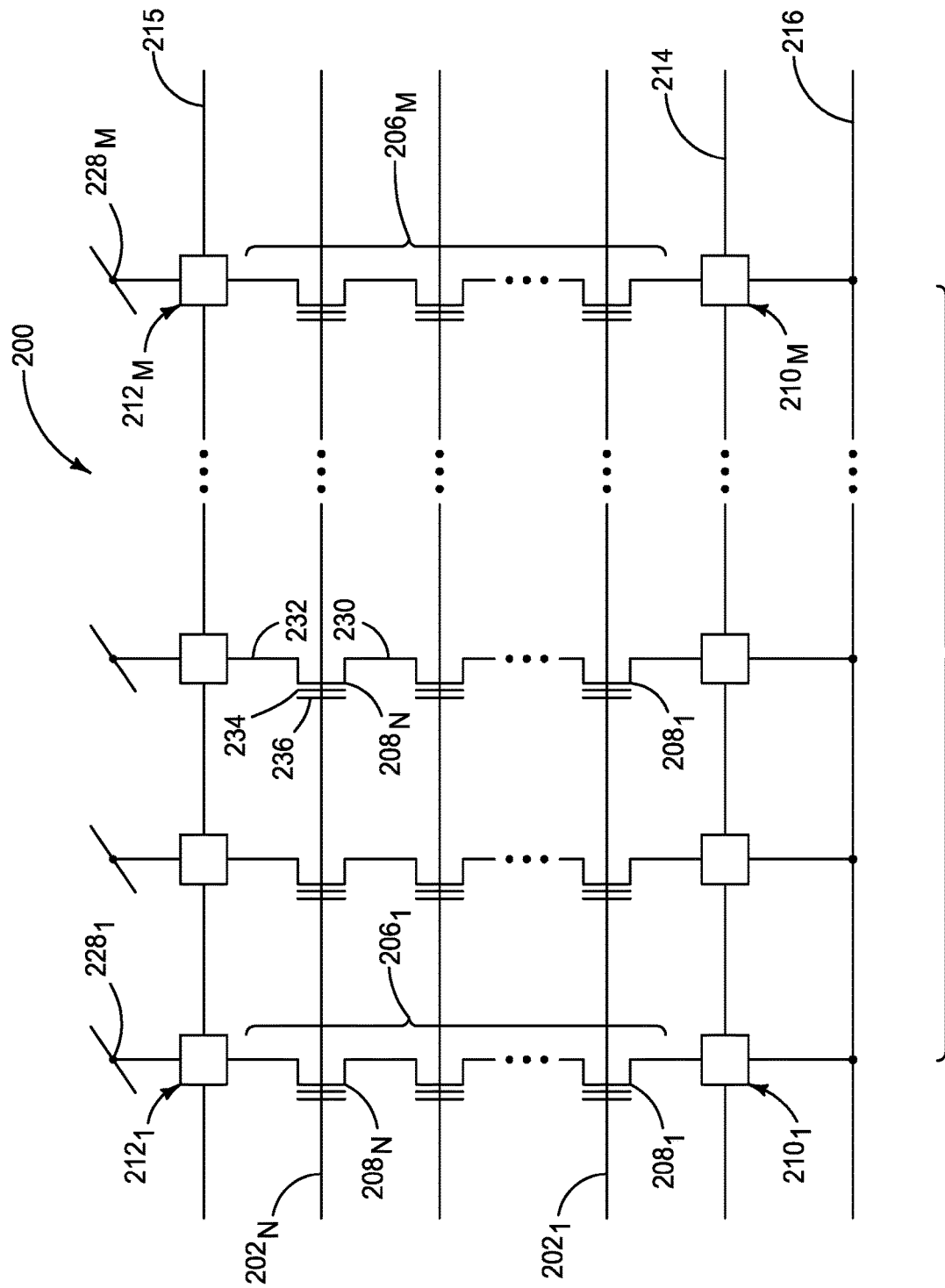
FIG. 4 is a schematic diagram of a prior art NAND memory array.
Figure 5:
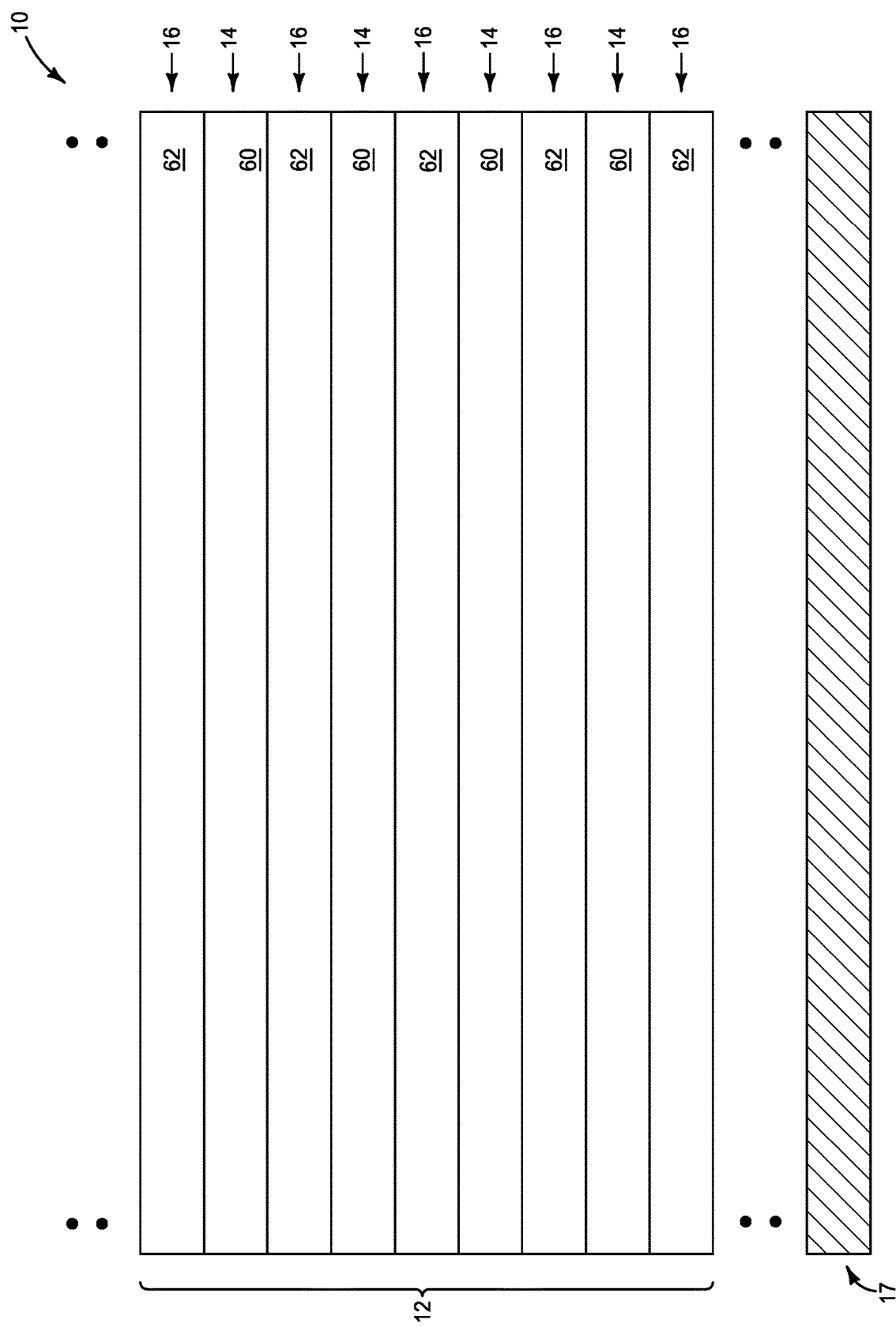
FIGS. 5 and 6 are diagrammatic cross-sectional side views of a region of an integrated assembly shown at example sequential process stages of an example method for fabricating an example memory device.

FIG. 5 shows a region of an integrated assembly (integrated structure, construction) 10 at an example process stage during the fabrication of memory cells.

The assembly 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon nitride; and the second material 62 may comprise, consist essentially of, or consist of silicon dioxide. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14 and 16 may have vertical thicknesses within a range of from about 15 nm to about 40 nm, within a range of from about 15 nm to about 20 nm, etc. There may be any suitable number of levels 14 and 16 within the stack 12. In some embodiments, there may be more than 10 of the levels within the stack, more than 50 of the levels within the stack, more than 100 of the levels within the stack, etc.

The stack 12 is shown to be supported by (formed over) a source structure 17.

The source structure 17 may correspond to source structures described with reference to FIGS. 1-4, and may be a line, an expanse, or any other suitable configuration. The source structure 17 may comprise any suitable materials, and in some applications may comprise conductively-doped semiconductor material (e.g., conductively-doped silicon) over metal-containing material (e.g., tungsten silicide).

The source structure 17 may be supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the stack 12 and the source structure 17. The gap is utilized to indicate that other components and materials may be provided between the illustrated region of the stack 12 and the source structure 17. Such other components and materials may comprise additional levels of the stack, source-side select gates (SGSs), etc. Similarly, a gap is provided over the stack to indicate that the stack may extend upwardly beyond the illustrated region of the stack, and to indicate that other components and materials (e.g., bitlines, drain-side select gates (SGDs), etc.) may be provided over the stack.

Figure 6:
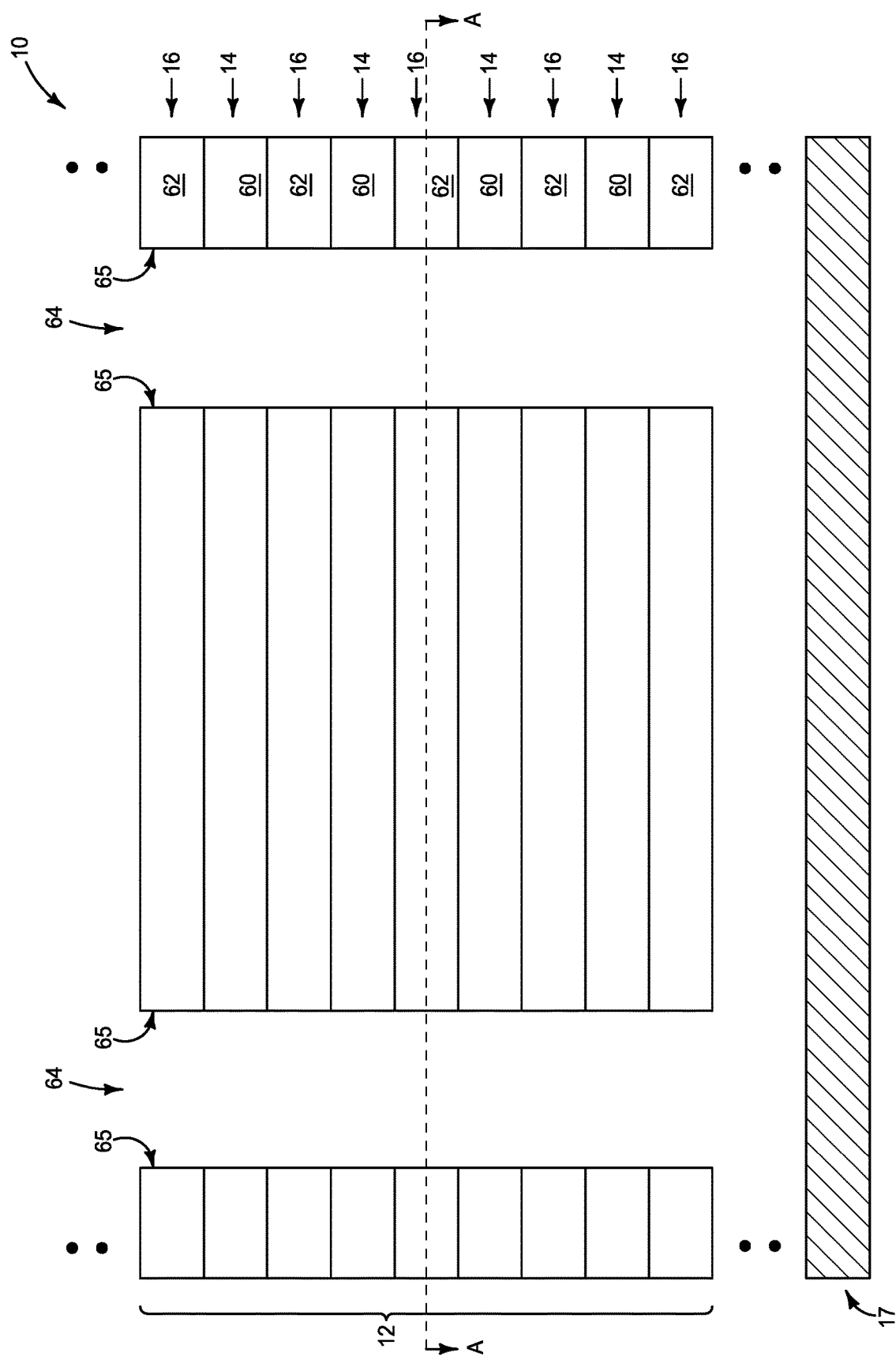
Figure 6A:
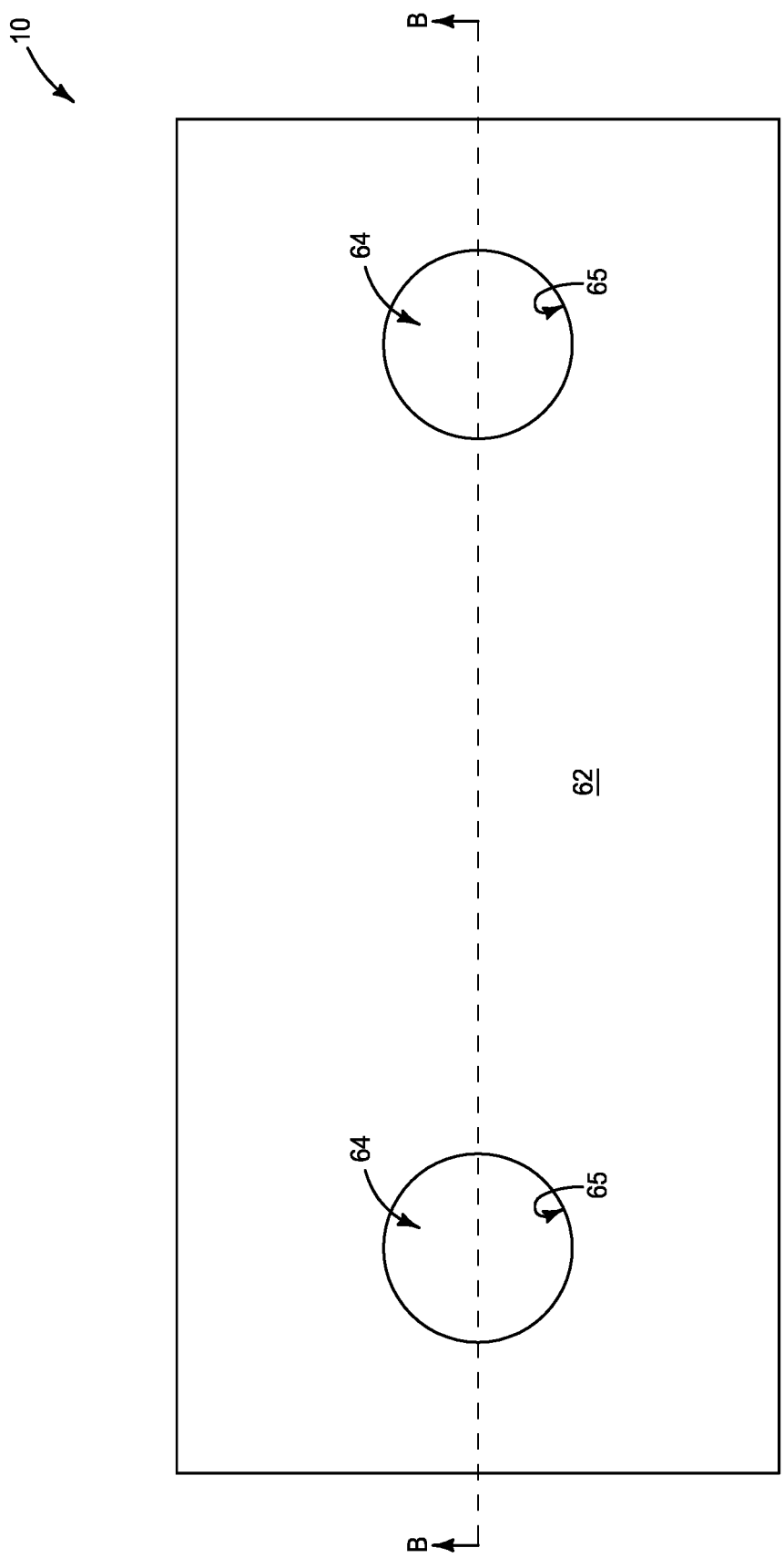
FIG. 6A is a diagrammatic sectional top-down view of the assembly of FIG. 6. The view of FIG. 6 is along the line B-B of FIG. 6A, and the view of FIG. 6A is along the line A-A of FIG. 6.

Referring to FIGS. 6 and 6A, openings 64 are formed to extend through the stack 12. The openings 64 may have any suitable shape along the top-down view of FIG. 6A, and may be circular (as shown), elliptical, square or other polygonal, etc.

The openings 64 may be representative of a large number of substantially identical openings formed at the process stage of FIGS. 6 and 6A and utilized for fabricating memory cells of a memory array (e.g., a NAND architecture). The term "substantially identical" means identical to within reasonable tolerances of fabrication and measurement.

The openings 64 have sidewalls 65 that extend across (along) the first and second levels 14 and 16.

Figure 7:
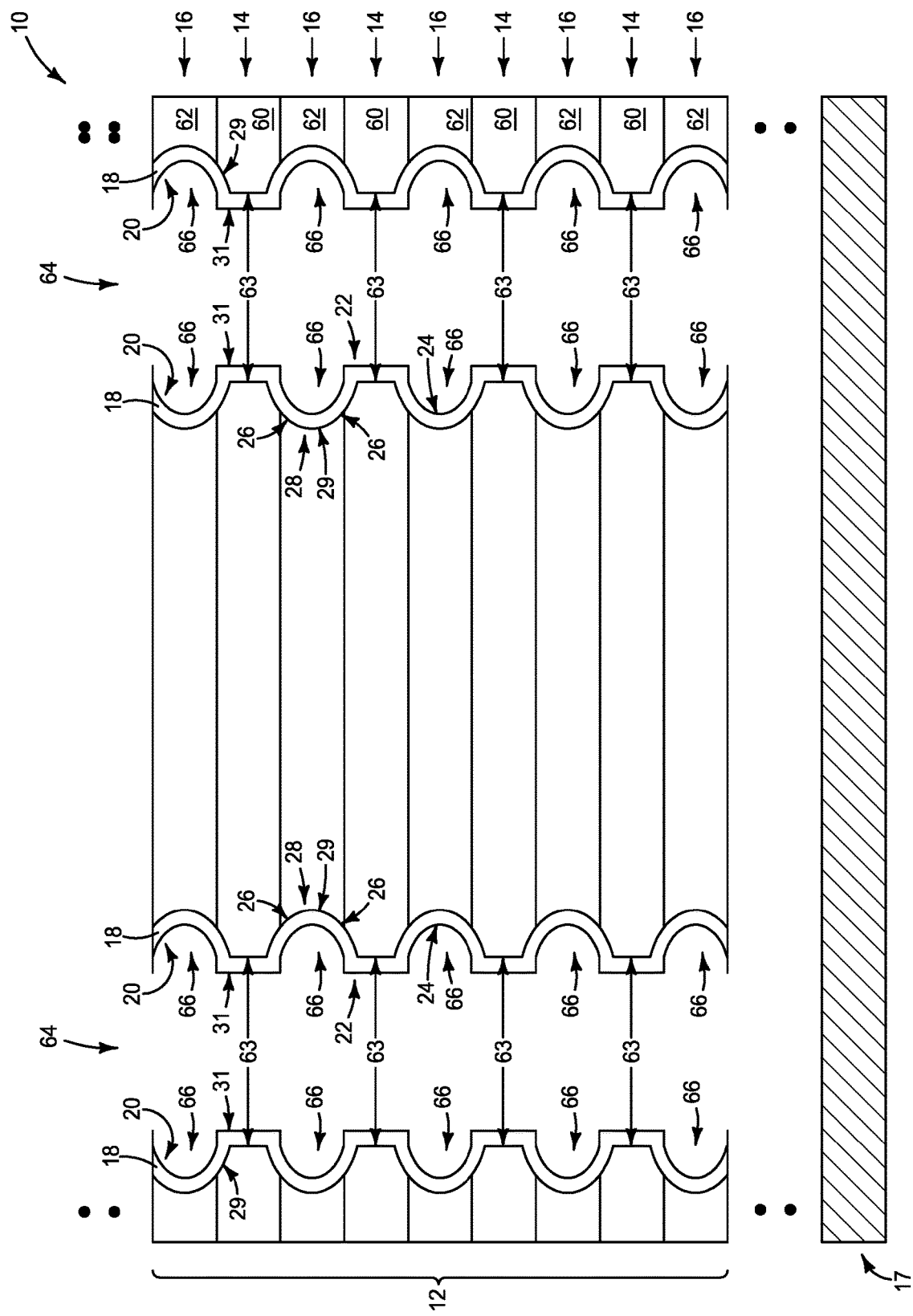
FIG. 7 is a diagrammatic cross-sectional side view of the region of the integrated assembly of FIG. 5 shown at an example process stage following that of FIG. 6.

Referring to FIG. 7, the second levels 16 are recessed relative to the first levels 14 to form cavities 66. The second levels 16 may be recessed by any suitable amount, and in some embodiments may be recessed to an amount within a range of from about 3 nm to about 30 nm, an amount within a range of from about 10 nm to about 20 nm, etc.

The first levels 14 have projecting terminal ends 63 which extend beyond the recessed second levels 16. The cavities 66 are along the recessed second levels 16, and are vertically between the projecting terminal ends 63.

A third material 18 is formed to extend around the projecting terminal ends 63 and within the cavities 66. The third material 18 narrows the cavities 62. The third material 18 may comprise any suitable composition(s). In some embodiments, the material 18 may be insulative material (dielectric material) and may correspond to a high-k material, with the term "high-k" meaning a dielectric constant greater than that of silicon dioxide (i.e., greater than about 3.9). In some embodiments, the dielectric material 18 may comprise, consist essentially of, or consist of one or more of AlO, HfO, HfSiO, ZrO and ZrSiO, where the chemical formulas indicate primary constituents rather than specific stoichiometries.

The third material 18 may comprise any suitable thickness, and in some embodiments may have a thickness within a range of from about 2 nm to about 10 nm, within a range of from about 2 nm to about 5 nm, etc.

The third material 18 is deposited conformally along the levels 14 and 16, and may be deposited with any suitable methodology (e.g., atomic layer deposition, chemical vapor deposition, etc.).

In some embodiments, the dielectric material 18 may be considered to be configured as ribbons 20 extending vertically across the levels 14 and 16 of the stack 12. Alternatively, the structures 20 may be referred to as high-k-dielectric-material-structures.

The ribbons 20 serpentine along the sidewalls of the openings 64. In the shown embodiment, the ribbons 20 have first portions 22 along the first levels 14, and have second portions 24 along the second levels 16. The first portions 22 are laterally outward of the projections 63. The second portions 24 are laterally offset relative to the first portions 22, and in some embodiments may be considered to be laterally inset into the materials of the stack 12 relative to the first portions 22. The second portions 24 may be considered to have first regions 26 adjacent the first levels 14, and to have second regions 28 between the first regions. The second regions 28 are laterally inset relative to the first regions 26 such that innermost surfaces 29 of the ribbons 20 along the second portions 24 have convex configurations.

In some embodiments, the surfaces 29 of the ribbons 20 may be considered to be first surfaces, and the ribbons 20 may be considered to have second surfaces 31 in opposing relation to the first surfaces 29. The surfaces 31 may be considered to correspond to exposed sidewalls of the openings 64 at the process stage of FIG. 7. In some embodiments, the ribbons 20 may be considered to be liners which narrow the openings 64 at the process stage of FIG. 7, and specifically which narrow the cavities 66.

Figure 7A:
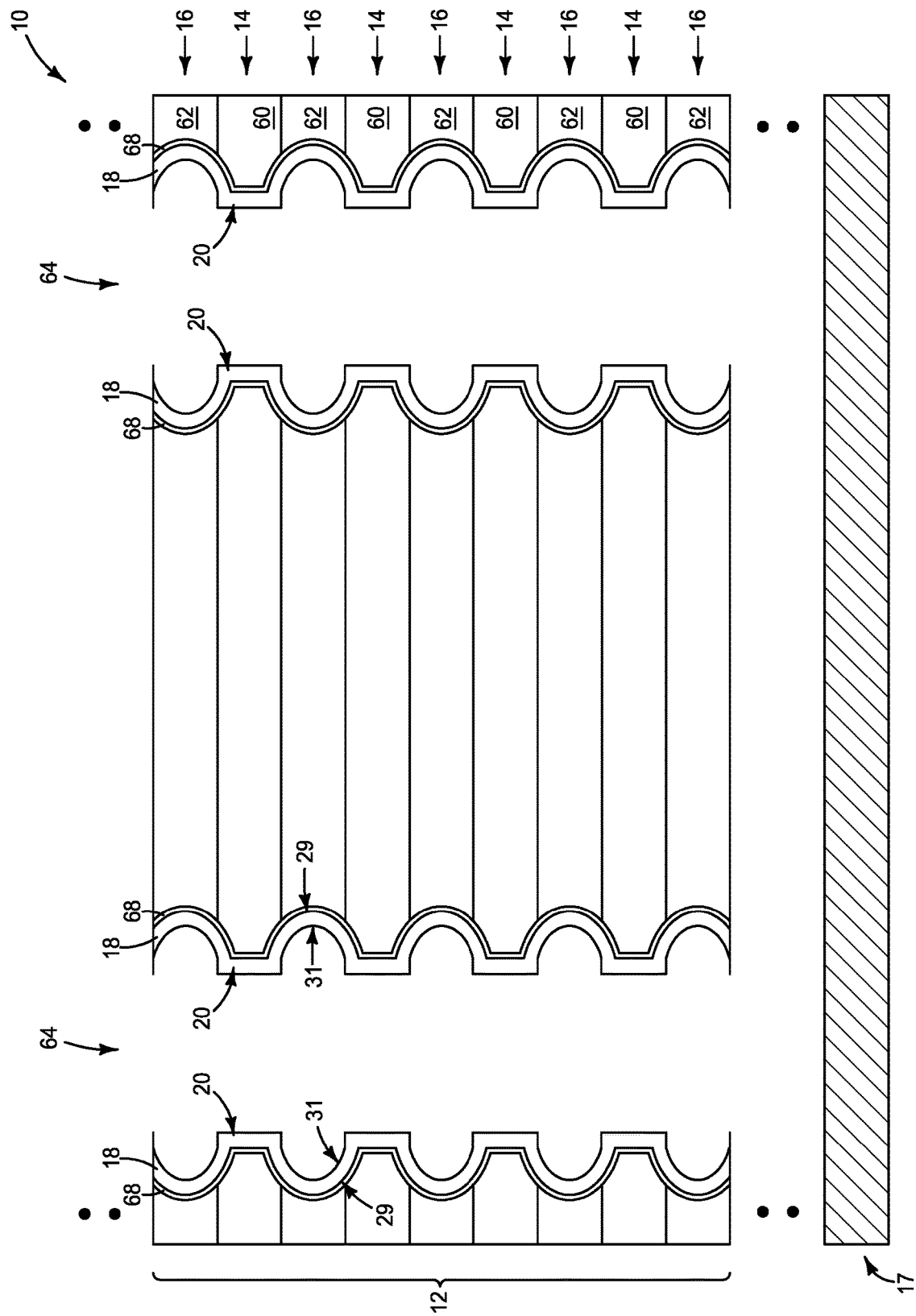
FIG. 7A is a diagrammatic cross-sectional side view of the region of the integrated assembly of FIG. 5 shown at an example process stage alternative to the process stage of FIG. 7.

FIG. 7A shows a process stage alternative to that of FIG. 7, and shows an optional protective material (protective-liner-material) 68 formed along the levels 14 and 16 prior to the material 18. The protective material 68 may function as an etch-stop to protect the material 18 during removal of the material 60 at a subsequent process step. The material 68 may comprise any suitable composition(s); and in some embodiments may comprise, consist essentially of, or consist of one or more oxides (e.g., silicon dioxide, aluminum oxide, tantalum oxide, carbon-doped silicon dioxide, etc.). In some embodiments, the material 68 may be referred to as an intervening material provided between the material 18 and the levels 14 and 16 of the stack 12.

Figure 8:
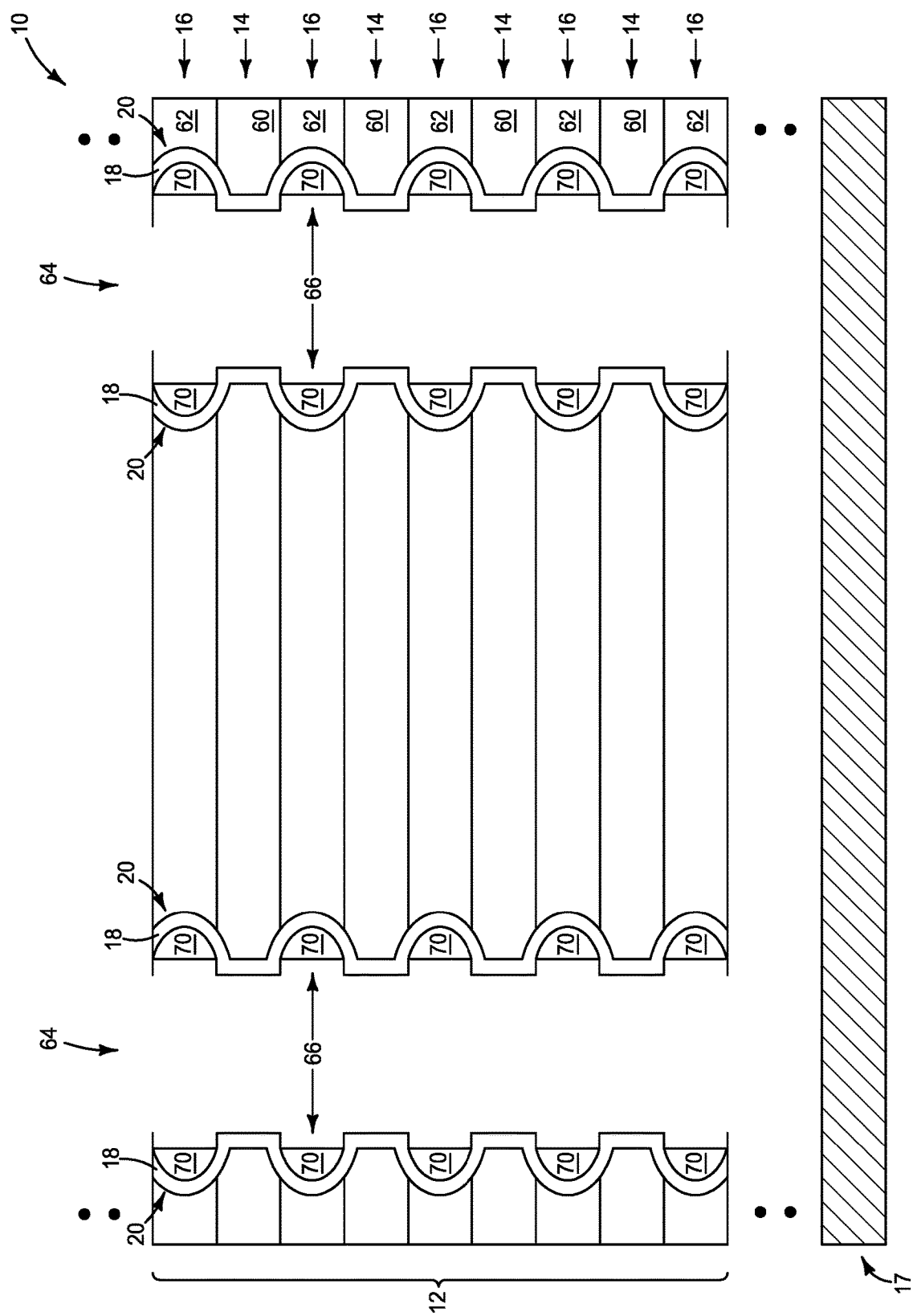
FIGS. 8-10 are diagrammatic cross-sectional side views of the region of the integrated assembly of FIG. 5 shown at example sequential process stage following the process stage of FIG. 7.

Referring to FIG. 8, a fourth material 70 is formed within the narrowed cavities 66. The fourth material may comprise any suitable composition(s); and in some embodiments may comprise, consist essentially of, or consist of silicon dioxide. Accordingly, the fourth material 70 may comprise a same composition as the second material 62 in some embodiments. In other embodiments, the materials 62 and 70 may comprise different compositions relative to one another. The fourth material 70 may be formed to initially at least partially fill the openings 64 and to line the sidewalls of such openings as well as to extend into the cavities 66, and then excess material 70 may be removed while leaving the material 70 within the cavities 66. The material 70 that is left within the cavities 66 may or may not be recessed within such cavities.

Figure 9:
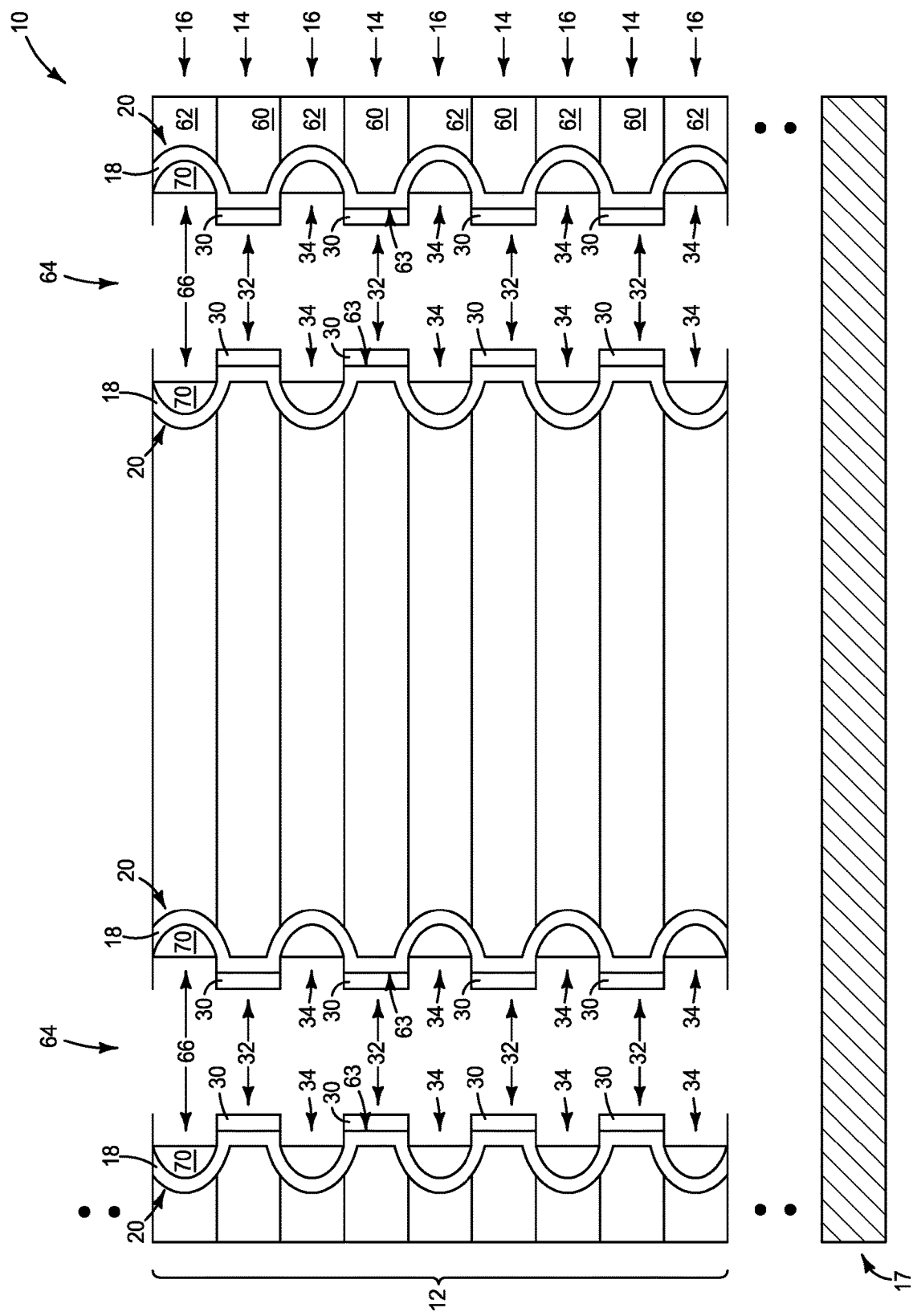

Referring to FIG. 9, charge-storage-material 30 (fifth material) is selectively formed along the third material 18 relative to the fourth material 70 to thereby form segments 32 of the charge-storage-material adjacent the projecting terminal ends 63 of the first levels 14. The segments 32 are vertically spaced from one another by intervening regions (gaps) 34, with such intervening regions being aligned with the second levels 16 (i.e., being elevationally coextensive with at least portions of the second levels). In some embodiments, the gaps 34 may be considered to be between vertically-neighboring segments of the charge-storage-material 30.

The charge-storage-material 30 may comprise any suitable composition(s), and in some embodiments may comprise, consist essentially of, or consist of silicon nitride.

The charge-storage-material 30 may be formed to any suitable lateral thickness. In some embodiments, such lateral thickness may be within a range of from about 5 nm to about 30 nm, within a range of from about 7 nm to about 15 nm, etc.

The charge-storage-material 30 may be selectively grown along the third material 18 with any suitable methodology. Example methodology may utilize, for example, one or both of atomic layer deposition (ALD) and chemical vapor deposition (CVD), and may utilize a growth promotor (accelerant) along surfaces of the third material 18 and/or may utilize a growth inhibitor (poison) along surfaces of the fourth material 70.

Figure 10:
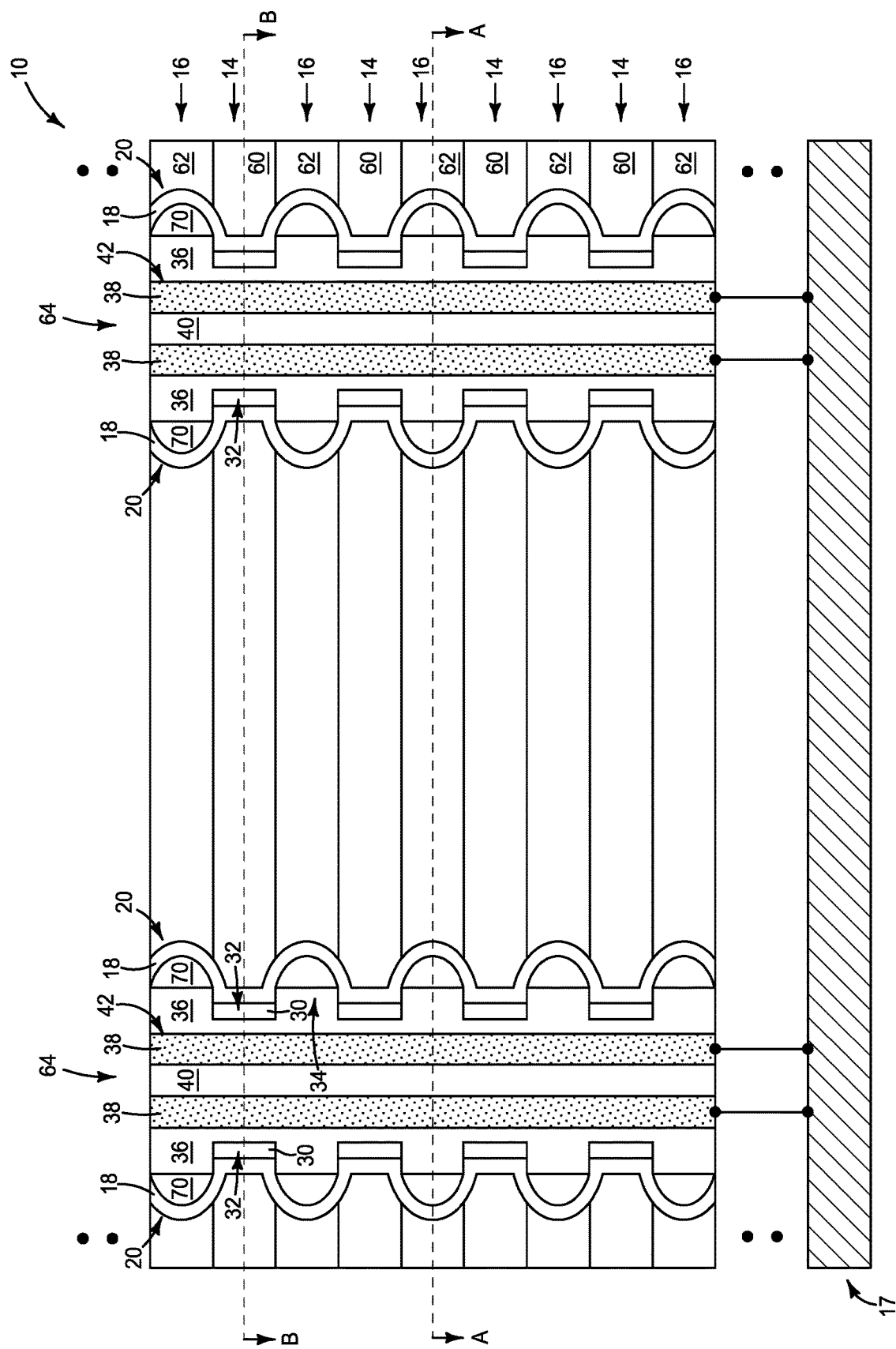
Figure 10A:
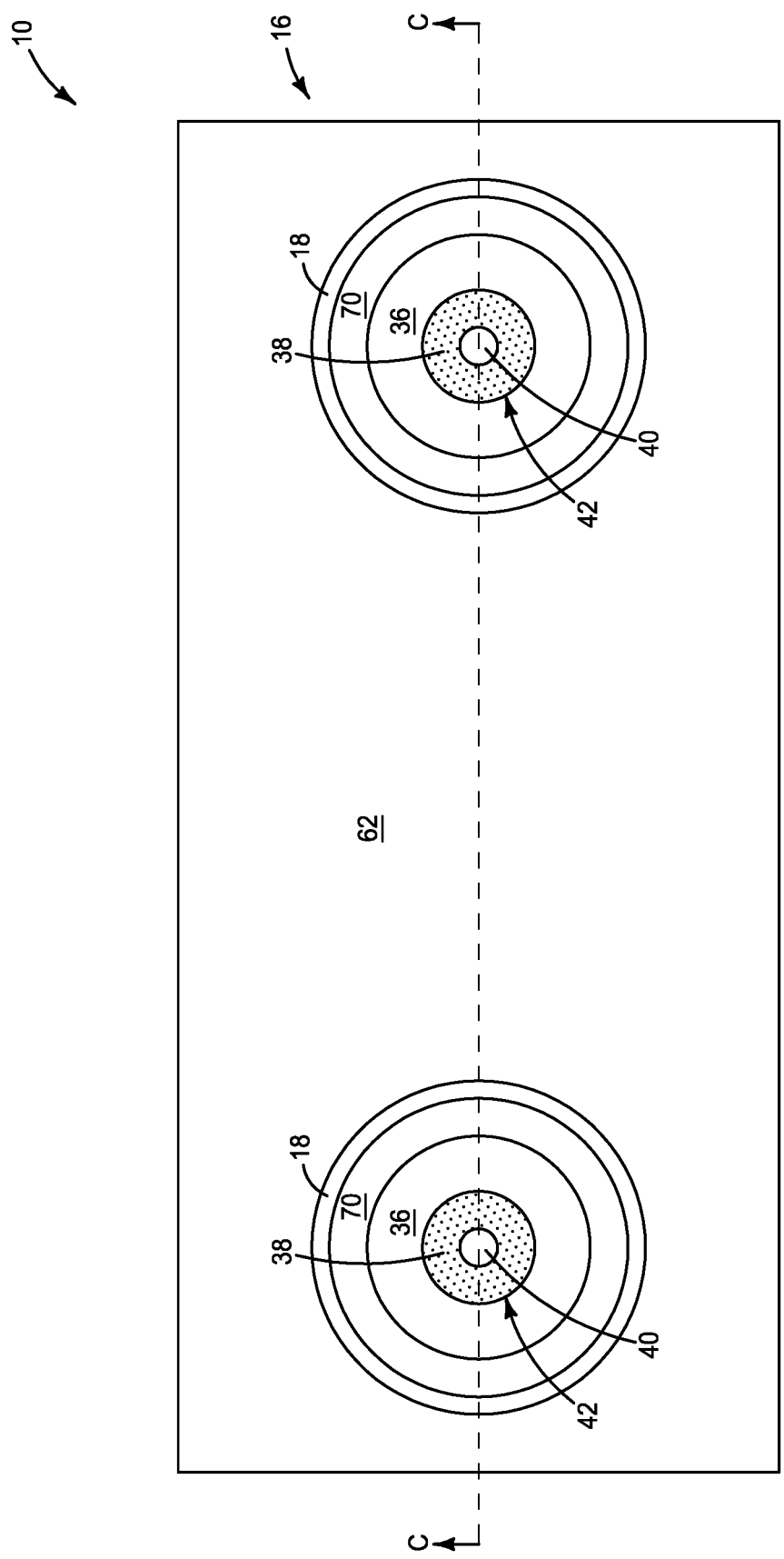
FIGS. 10A and 10B are diagrammatic sectional top-down views of the assembly of FIG. 10. The view of FIG. 10 is along the lines C-C of FIGS. 10A and 10B. The views of FIGS. 10A and 10B are along the lines A-A and B-B, respectively, of FIG. 10.
Figure 10B:
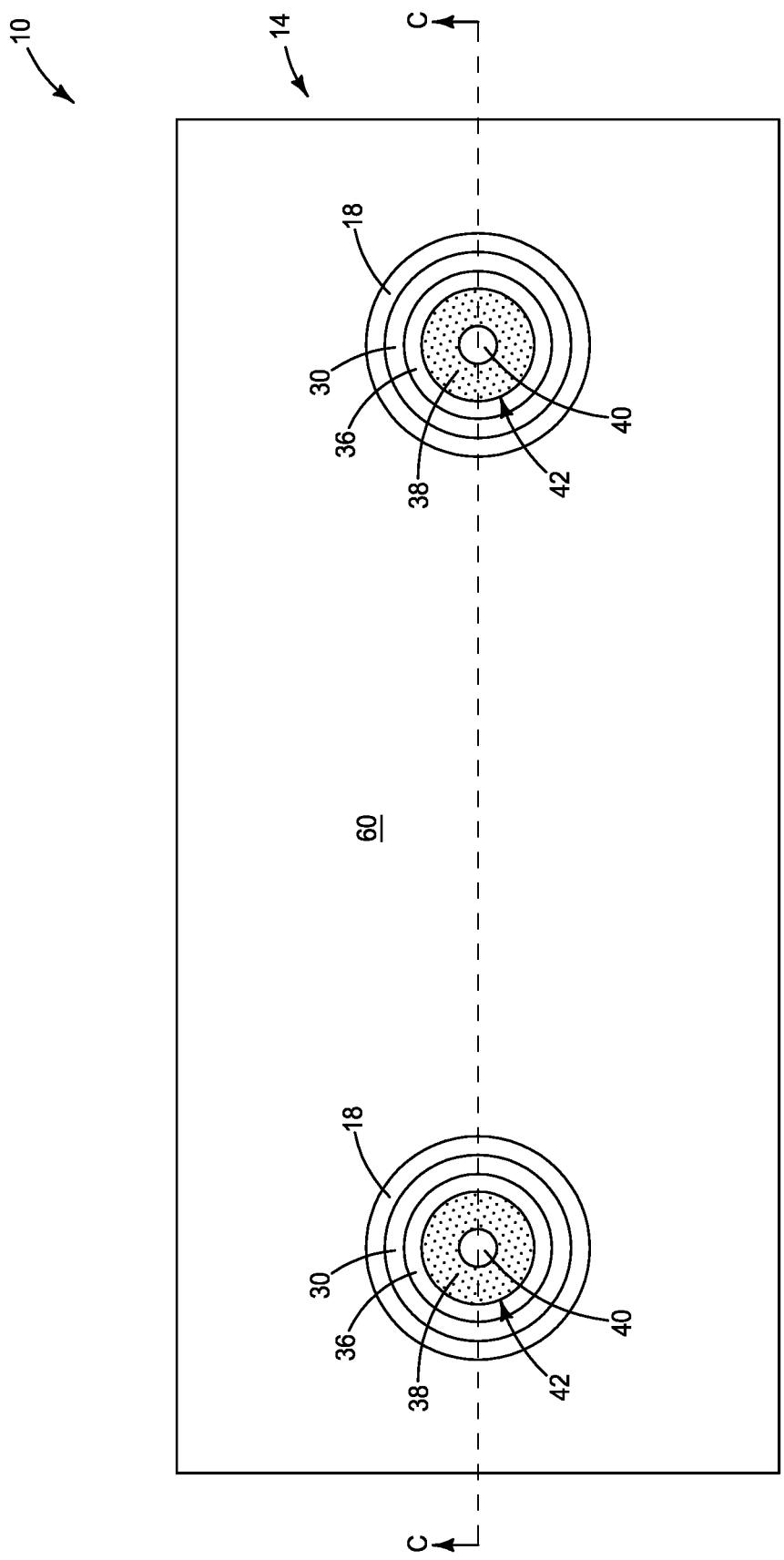

Referring to FIGS. 10-10B, cell materials (memory cell materials) 36 and 38 are formed within the openings 64.

The material 36 is gate-dielectric-material (i.e., tunneling material, charge-passage-material). The gate-dielectric-material 36 may comprise any suitable composition(s). In some embodiments, the gate-dielectric-material 36 may comprise, for example, one or more of silicon dioxide, silicon nitride, silicon oxynitride, aluminum oxide, hafnium oxide, zirconium oxide, etc. The gate-dielectric-material 36 may be bandgap-engineered to achieve desired electrical properties, and accordingly may comprise a combination of two or more different materials. The gate-dielectric-material 36 is formed within the openings 64 and is directly adjacent to the charge-storage-material 30.

The material 38 is channel material. The channel material 38 is formed within the openings 64 and is directly adjacent to the tunneling material 36.

The channel material 38 comprises semiconductor material, and may comprise any suitable composition or combination of compositions. For instance, the channel material 38 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 38 may comprise, consist essentially of, or consist of silicon. The channel material 38 is shown with stippling to assist the reader in identifying the channel material.

In the illustrated embodiment, insulative material 40 is formed adjacent the channel material 38, and fills central regions of the openings 64. The insulative material 40 may comprise any suitable composition(s); and in some embodiments may comprise, consist essentially of, or consist of silicon dioxide. The illustrated embodiment of FIGS. 10-10B shows the channel material 38 configured as an annular ring which surrounds the insulative material 40. Such configuration of the channel material may be considered to comprise a hollow channel configuration, in that the insulative material 40 is provided within a "hollow" in the annular-ring-shaped channel configuration. In other embodiments (not shown), the channel material may be configured as a solid pillar configuration.

The channel material 38 is shown to be electrically coupled with the source structure 17 in the cross-sectional view of FIG. 10. Such electrical coupling may be accomplished with any suitable configuration. For instance, in some embodiments the channel material 38 may directly contact the source structure 17.

The channel material 38 may be considered to be configured as channel-material-pillars 42 which extend vertically through the stack 12. The illustrated openings 64 may be considered to be representative of a large number of substantially identical openings that may be formed at the processing stage of FIGS. 10-10B, and the illustrated channel-material-pillars 42 may be considered to be representative of a large number of substantially identical channel-material-pillars that may be formed at the processing stage of FIGS. 10-10B. For instance, in some embodiments there may be hundreds, thousands, hundreds of thousands, millions, hundreds of millions, etc., of the channel-material-pillars formed at the processing stage of FIGS. 10-10B.

The lateral thicknesses of the materials 18, 70, 30, 36, 38 and 40 of FIGS. 10-10B are for illustrative purposes only. In practice, the relative lateral thicknesses of the materials 18, 70, 30, 36, 38 and 40 may be different than shown. For instance, the high-k-dielectric-material 18 may be much thinner than the charge-storage-material 30. As another example, the regions of the tunneling material 36 between the charge-storage-material 30 and the channel material 38 may be much thinner than the charge-storage-material 30.

Figure 11:
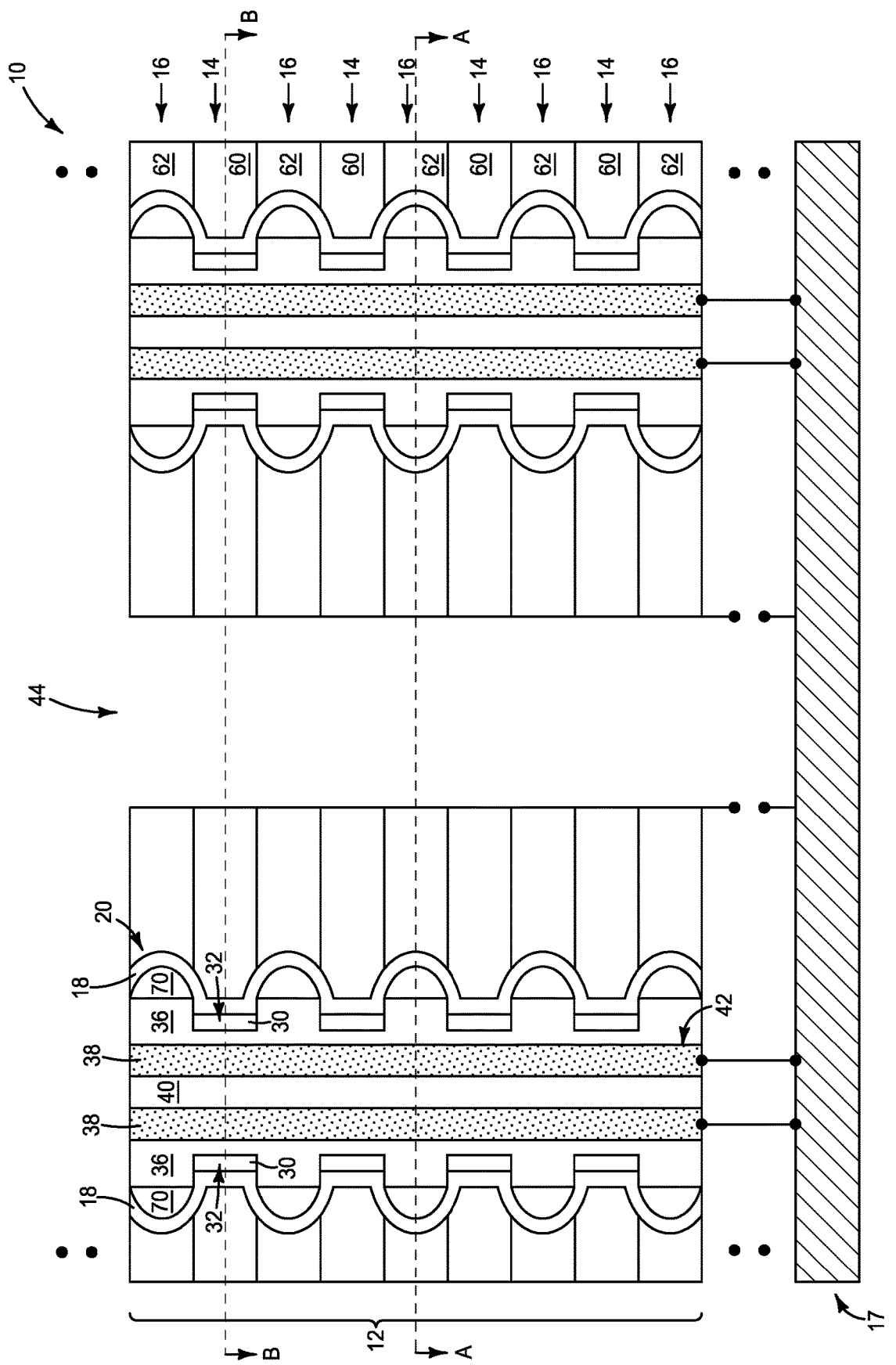
FIG. 11 is a diagrammatic cross-sectional side view of the region of the integrated assembly of FIG. 5 shown at an example process stage following that of FIG. 10.
Figure 11A:
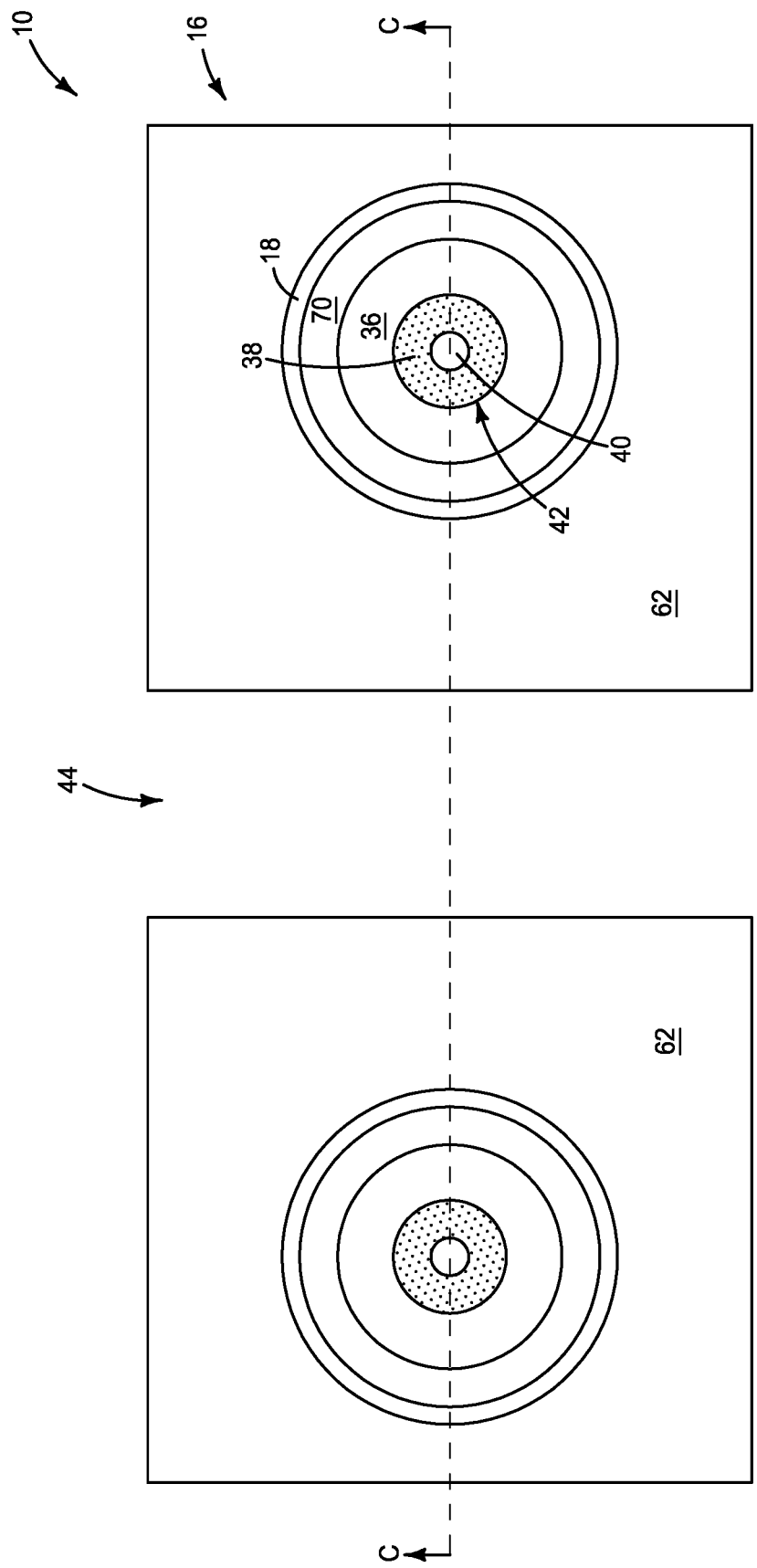
FIGS. 11A and 11B are diagrammatic sectional top-down views of the assembly of FIG. 11. The view of FIG. 11 is along the lines C-C of FIGS. 11A and 11B. The views of FIGS. 11A and 11B are along the lines A-A and B-B, respectively, of FIG. 11.
Figure 11B:
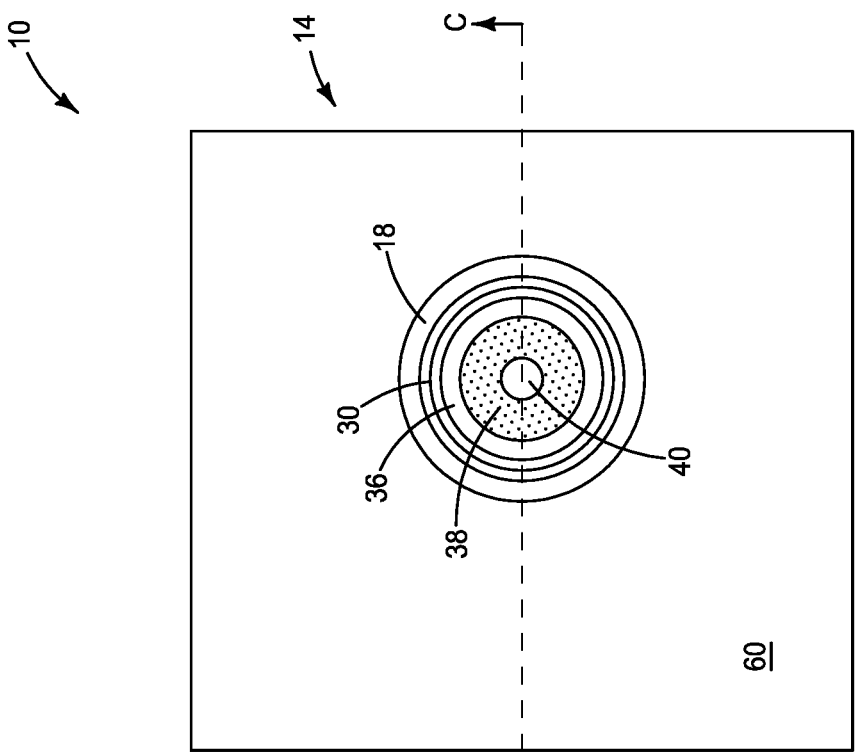
Figure 11B:
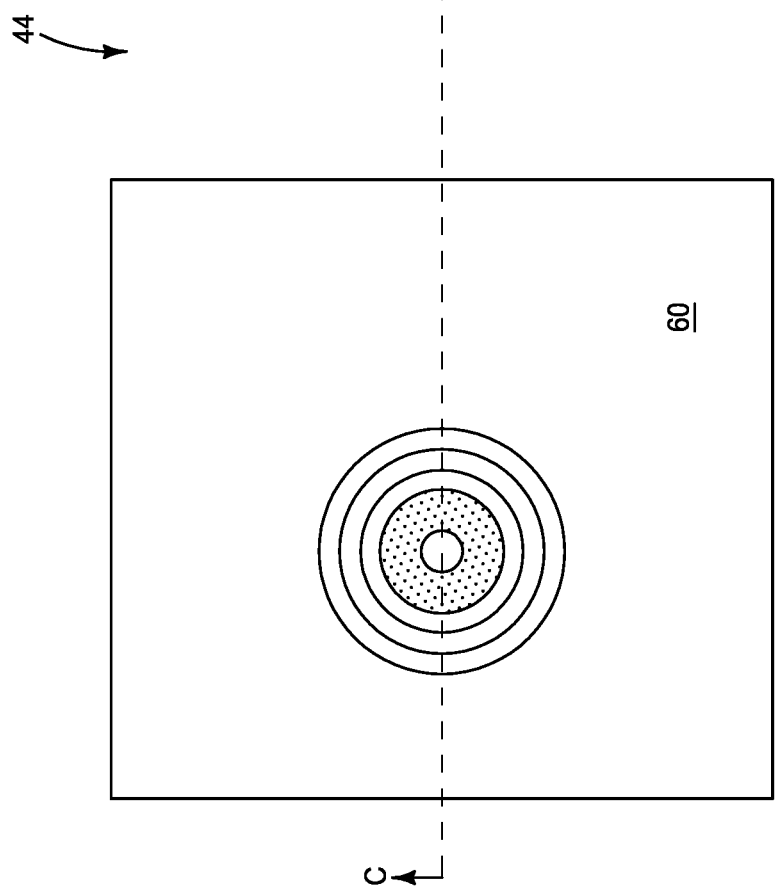

Referring to FIGS. 11-11B, a slit 44 is formed to extend through the stack 12. The illustrated slit 44 may be representative of a large number of substantially identical slits formed at the process stage of FIGS. 11-11B.

Figure 12:
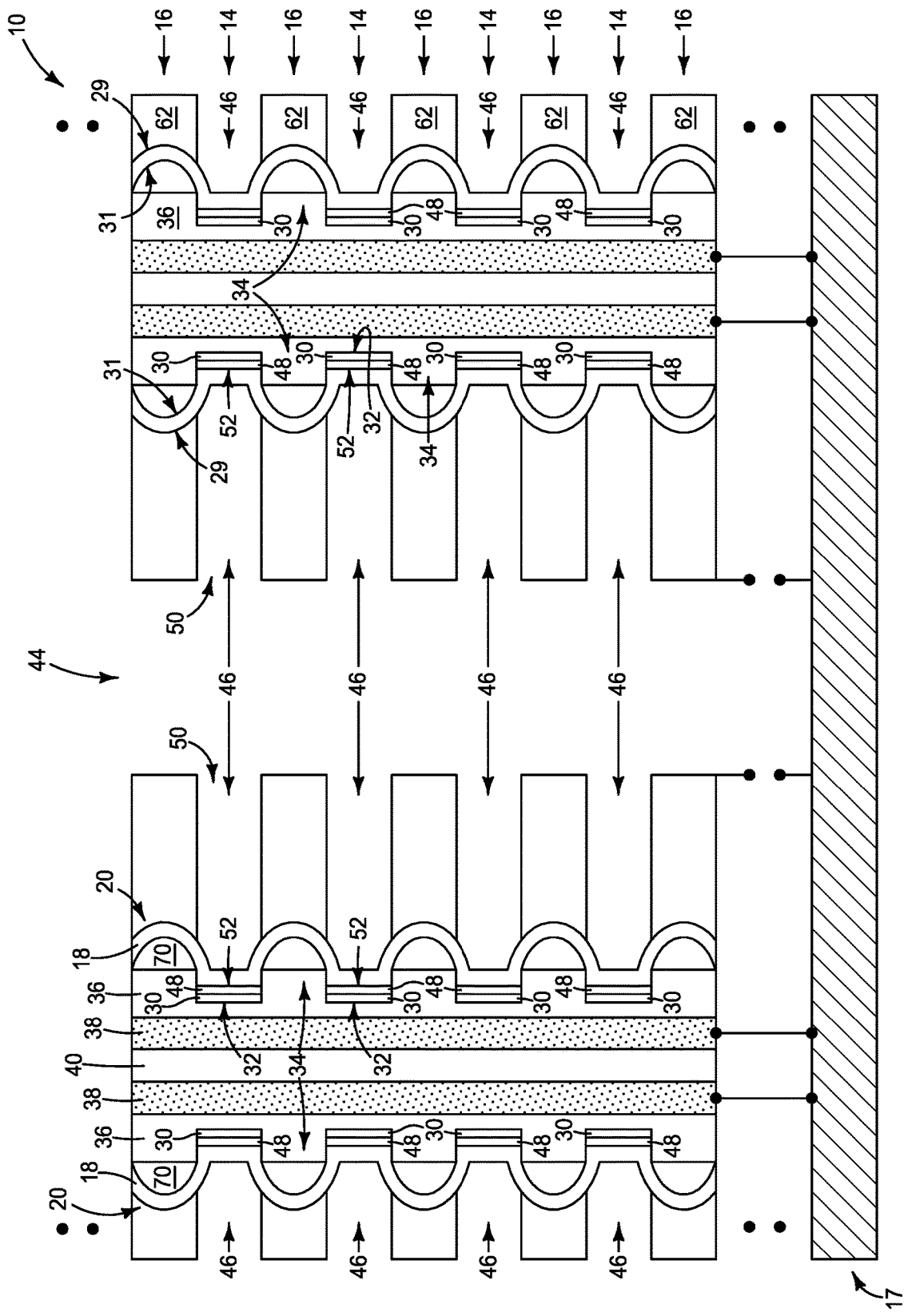
FIG. 12 is a diagrammatic cross-sectional side view of the region of the integrated assembly of FIG. 5 shown at an example process stage following that of FIG. 11.

Referring to FIG. 12, the first material 60 (FIGS. 11-11B) is removed, which leaves voids (conduits) 46 along the first levels 14 (i.e., between the second levels 16). The voids 46 may be formed with any suitable process. In some embodiments such process may utilize etchant (e.g., hot phosphoric acid) flowed into the slit 44.

One or more substances 50 are flowed through the slit 44 and conduits 46, and passed through the third material 18 to modify portions of the charge-storage-material 30 and convert such portions into charge-blocking-material 48. In some embodiments, the substance(s) 50 comprise one or more oxidants (e.g., $H_2O_2$, $O_3$, etc.), the charge-storage-material 30 comprises silicon nitride, and the charge-blocking-material 48 comprises silicon and oxygen (e.g., silicon dioxide). The charge-blocking-material 48 may or may not comprise nitrogen in addition to the silicon and oxygen, depending on how completely the silicon nitride of the charge-storage-material 30 is oxidized.

Portions of the charge-storage-material 30 proximal the conduits 46 are modified to form the charge-blocking-material 48 while portions of the charge-storage-material 30 distal from the conduits 46 remain unmodified. The charge-blocking-material 48 of the modified portions is directly against the charge-storage-material 30 of the unmodified portions. Although the charge-blocking-material 48 is shown to be of about the same lateral thickness as the charge-storage-material 30 after the conversion of some of the charge-storage-material 30 into the charge-blocking-material 48, in other embodiments the relative amount of the charge-storage-material 30 converted into the charge-blocking-material 48 may be varied so that the charge-blocking-material 48 is laterally thicker than, or laterally thinner than, the remaining portion of the charge-storage-material 30. The relative thicknesses of the materials 30 and 48 may be tailored for particular applications.

The charge-blocking-material 48 is configured as segments 52, with such segments being vertically spaced from one another by the intervening regions (gaps) 34. In the shown embodiment of FIG. 12, the charge-blocking-material-segments 52 are about a same vertical length as the charge-storage-material-segments 32.

The embodiment of FIG. 12 shows the etch utilized to form the voids stopping at the material 18. In some embodiments it may be difficult to stop such etch at the material 18, and accordingly the protective material 68 of FIG. 7A may be provided to assist in stopping the etch prior to penetrating through the material 18.

Figure 12A:
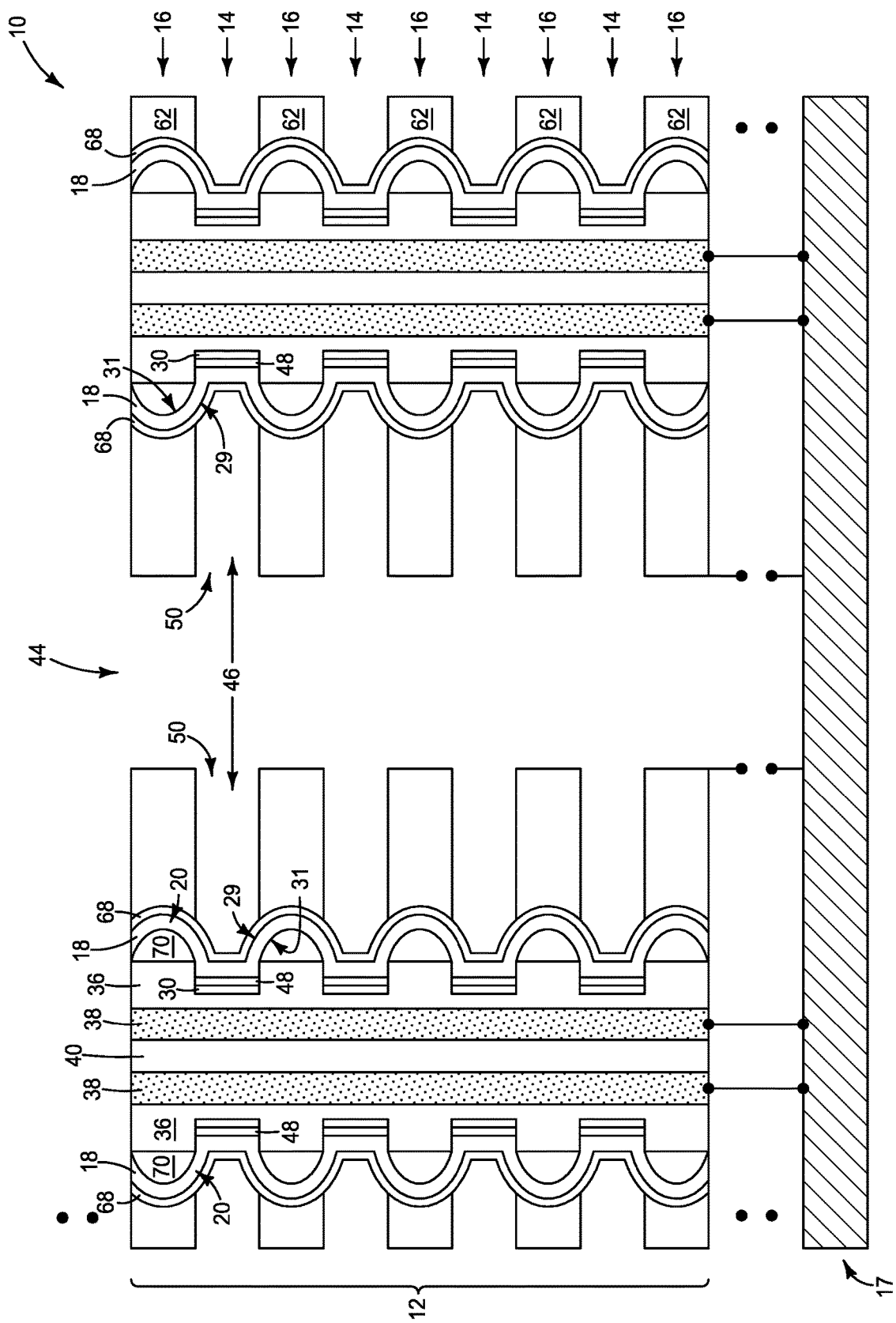
FIGS. 12A and 12B are diagrammatic cross-sectional side views of the region of the integrated assembly of FIG. 5 shown at example process stages alternative to that of FIG. 12.

FIG. 12A shows an embodiment in which the protective material (protective-liner-material) 68 is provided along the innermost surfaces 29 of the ribbons 20 of material 18 to protect the material 18 during the etching utilized to form the conduits 46. Subsequently, the substance 50 is passed through the materials 68 and 18 to form the charge-blocking-material 48.

Figure 12B:
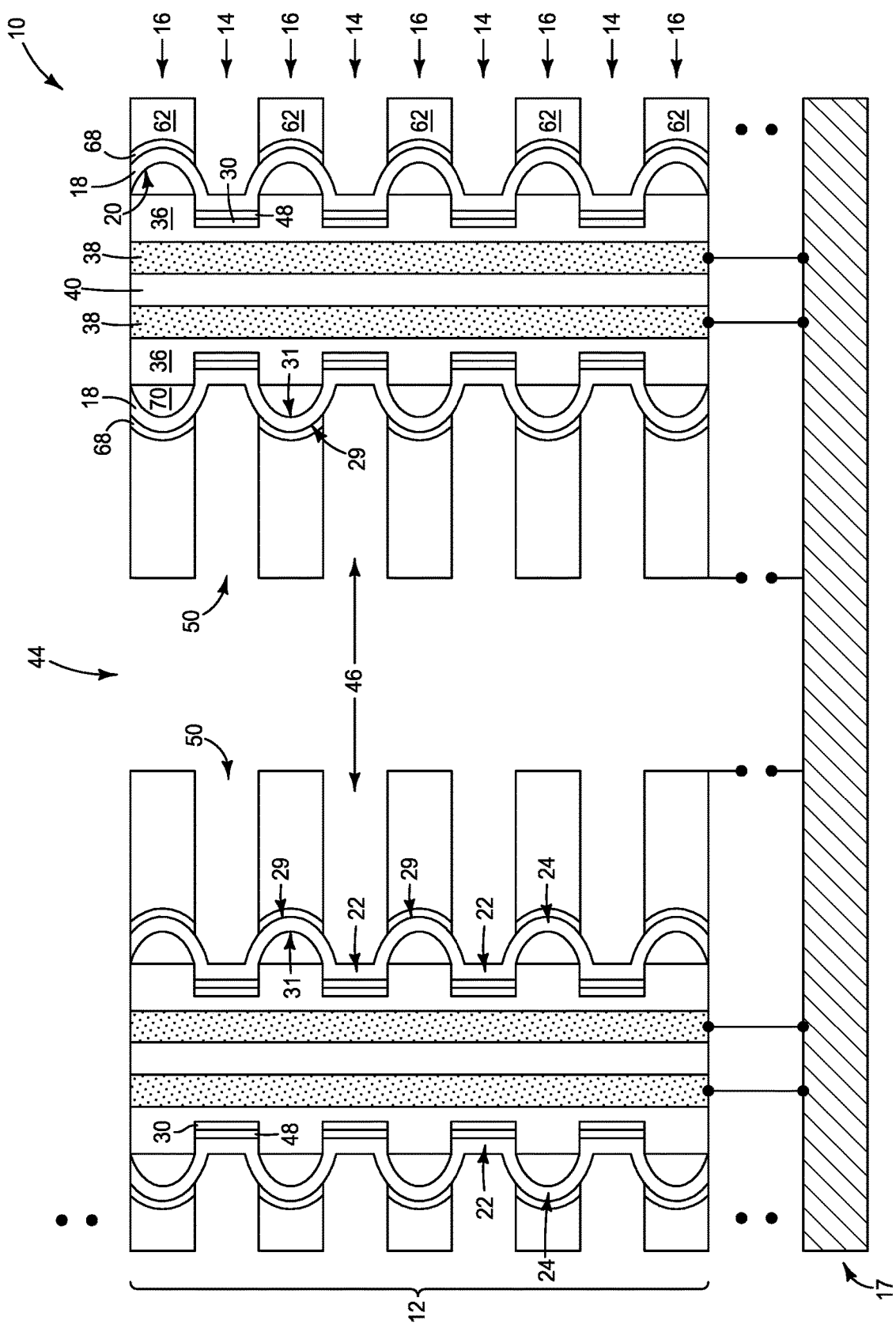

FIG. 12B shows an alternative embodiment in which the protective material 68 is provided along the innermost surfaces 29 of the ribbons 20 to protect the material 18 during the etching utilized to form the conduits 46, but in which the conduits are extended through the material 20 prior to utilization of the substance 50. Subsequently, the substance 50 is passed through only the material 18 to form the charge-blocking-material 48. The embodiment of FIG. 12B may be considered to have the protective material (in some embodiments, oxide-containing material) 68 along the first surfaces 29 within the second levels 16 of the stack 12 (i.e., along the second portions 24 of the ribbons 20), but not within the first levels 14 of the stack (i.e., not along the first portions 22 of the ribbons 20).

Figure 13:
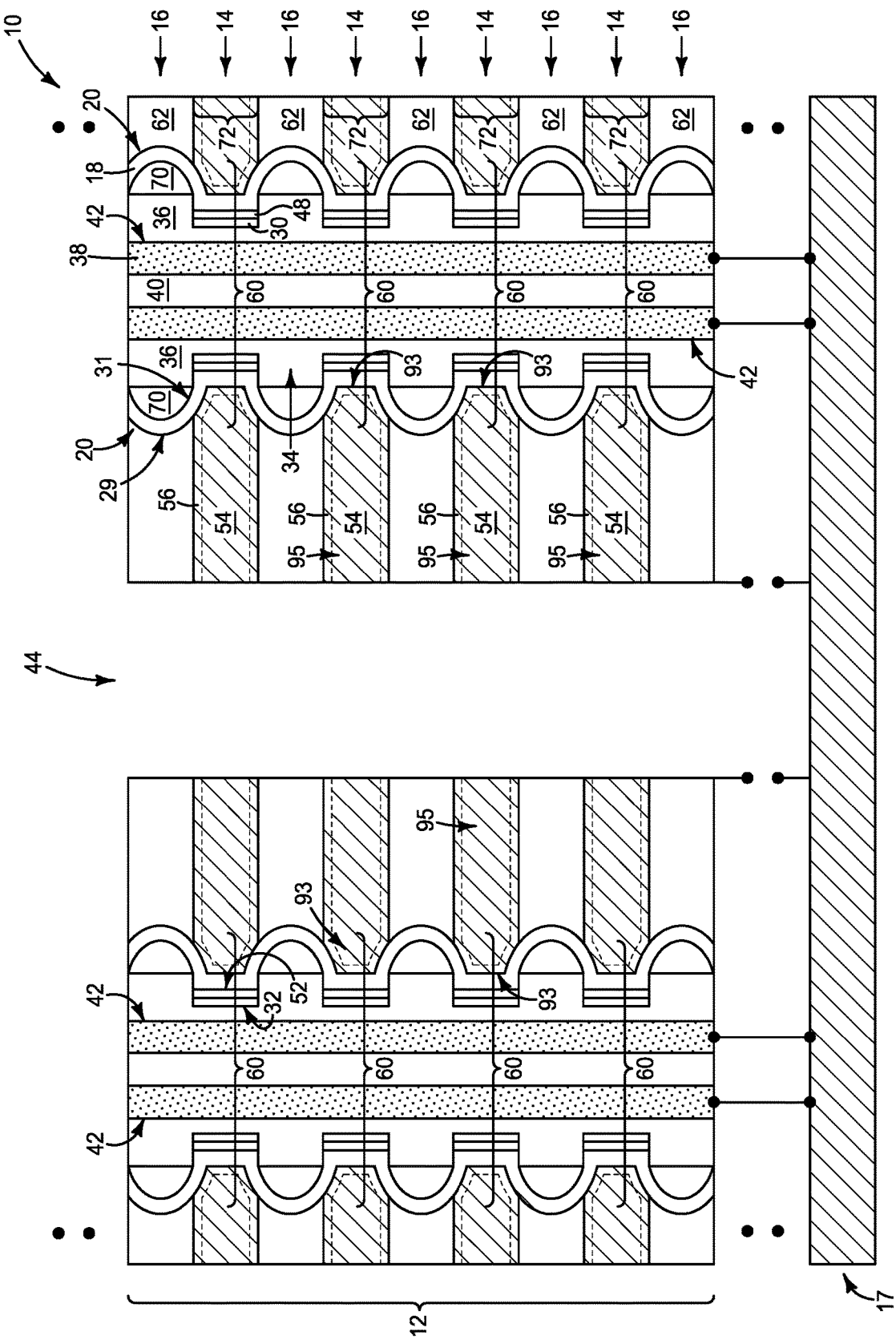
FIGS. 13 and 14 are diagrammatic cross-sectional side views of the region of the integrated assembly of FIG. 5 shown at example sequential process stage following the process stage of FIG. 12.

Referring to FIG. 13, the voids 46 (FIG. 12) are filled with conductive material 72. Accordingly, the stack 12 becomes a stack of alternating conductive levels 14 and insulative levels 16.

The conductive material 72 of the conductive levels 14 may comprise a single homogeneous composition, or may comprise a laminate of two or more different compositions. In the illustrated embodiment, dashed lines are provided within the conductive material 72 to indicate that the material 72 may comprise a conductive-core-material 54, and a conductive-liner-material 56 along an outer periphery (outer peripheral surface) of the conductive-core-material. The conductive-liner-material 56 may at least partially surround the outer periphery of the conductive-core-material 54.

The conductive-core-material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive-core-material 54 may comprise one or more metals (e.g., may comprise tungsten).

The conductive-liner-material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, conductive-liner-material 56 may comprise one or more metal nitrides (e.g., may comprise titanium nitride, tungsten nitride, etc.).

The conductive levels 14 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The stack 12 is indicated to extend vertically beyond the illustrated region to show that there may be more vertically-stacked levels than those specifically illustrated in the diagram of FIG. 13.

In some embodiments, the third material 18 may be dielectric-barrier-material. NAND memory cells 60 may comprise the dielectric-barrier-material 18, the charge-blocking-material 48, the charge-storage-material 30, the tunneling material 36 and the channel material 38. The illustrated NAND memory cells 60 form portions of vertically-extending strings of memory cells. Such strings may be representative of a large number of substantially identical NAND strings formed during fabrication of a NAND memory array (with the term "substantially identical" meaning identical to within reasonable tolerances of fabrication and measurement).

The conductive levels 14 have terminal regions (proximal regions) 93 proximate the channel-material-pillars 42, with such terminal regions being laterally offset from the channel-material-pillars by intervening regions comprising the materials 18, 48, 30 and 36. The conductive levels also have distal regions 95 further from the channel-material-pillars 42 than the terminal regions 93. In some embodiments, the terminal regions 93 may be considered to correspond to control gate regions of the memory cells 60, and the distal regions 95 may be considered to correspond to wordline regions (routing regions) which couple the control gate circuitry with other circuitry (e.g., driver circuitry). The control gate regions 93 may comprise control gates analogous to those described above with reference to FIGS. 1-4, and in some embodiments may be referred to as control gates.

Figure 14:
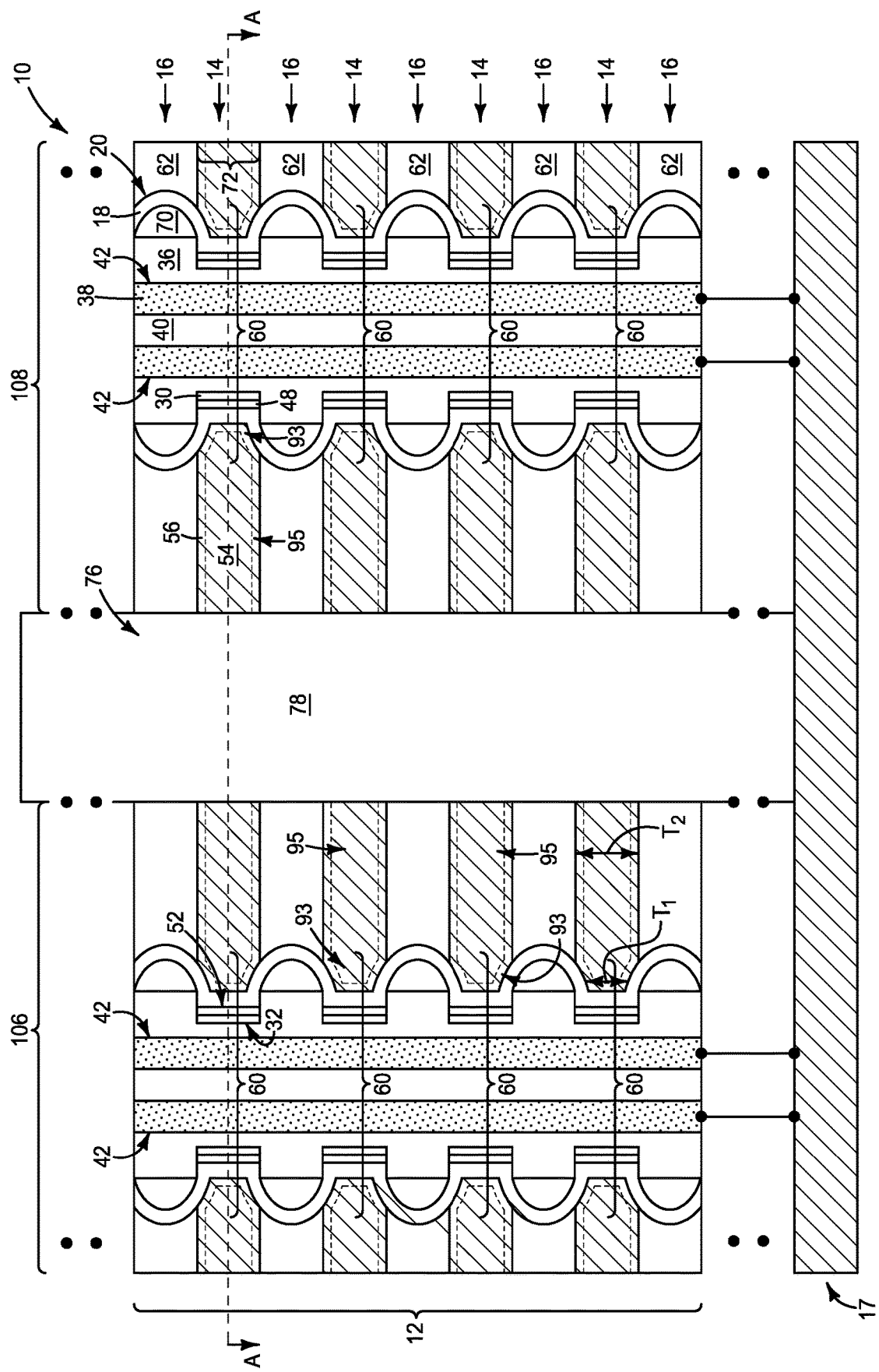
Figure 14A:
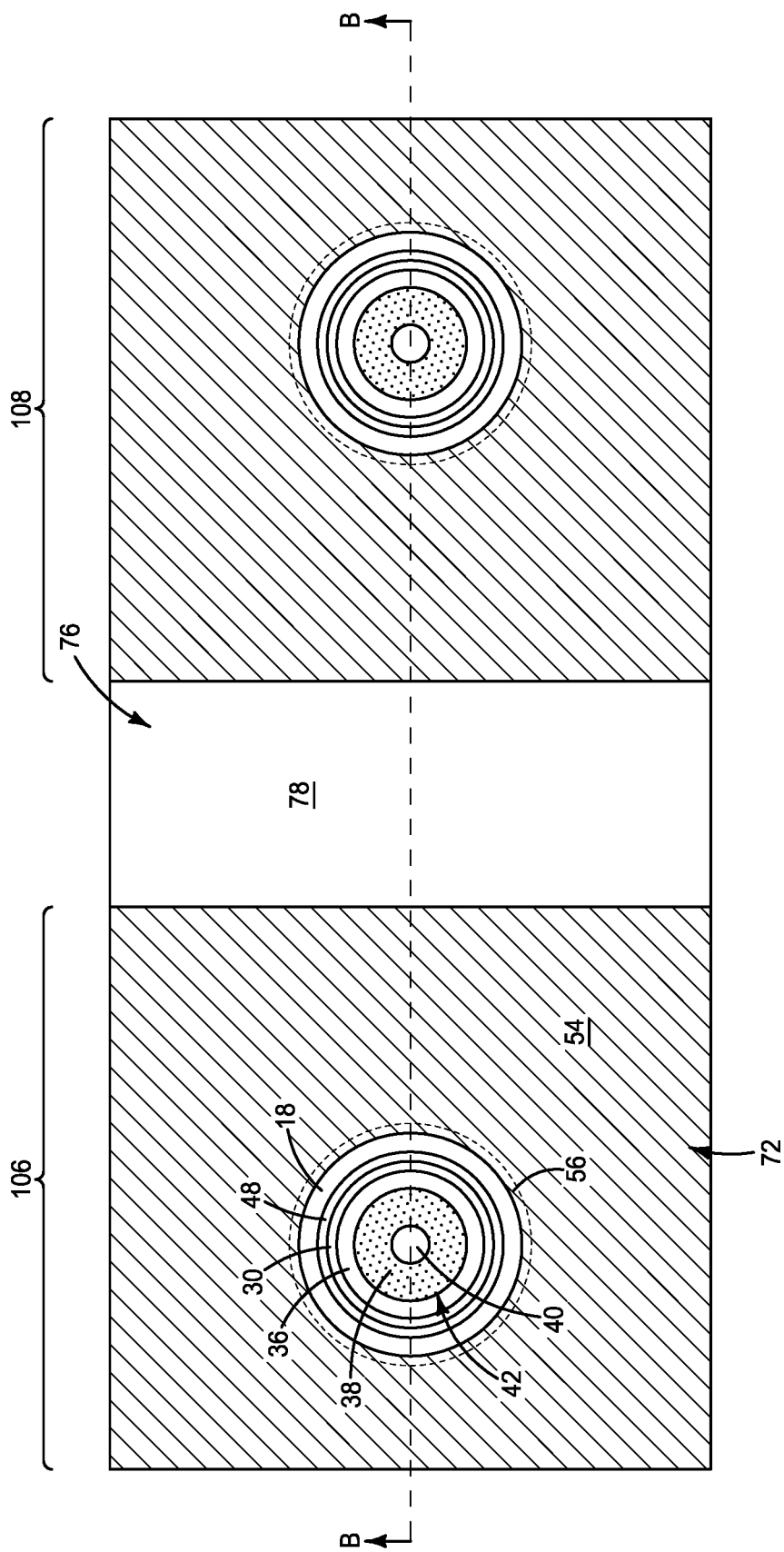
FIG. 14A is a diagrammatic sectional top-down view of the assembly of FIG. 14. The view of FIG. 14 is along the line B-B of FIG. 14A, and the view of FIG. 14A is along the line A-A of FIG. 14.

Referring to FIGS. 14 and 14A, a panel 76 is formed within the slit 44 (FIG. 13). The panel comprises panel material 78. The panel material 78 may comprise any suitable composition(s), and in some embodiments may comprise, consist essentially of, or consist of silicon dioxide. Although the panel 76 is shown to comprise a single homogeneous material, in other embodiments the panel may comprise a laminate of two or more different materials.

The panel 76 may divide the pillars 42 between a first block region 106 and a second block region 108. Each of the pillars 42 may be considered to be associated with a vertical stack of memory cells (e.g., NAND memory cells) 60. The memory cells 60 on one side of the panel 76 may be considered to be within the first block region (memory-block-region) 106, and the memory cells 60 on the other side of the panel 76 may be considered to be within the second block region (memory-block-region) 108. The block regions 106 and 108 may be analogous to the memory blocks (or memory sub-blocks) described above in the "Background" section of this disclosure.

In operation, the charge-storage material 30 may be configured to store information in the memory cells 60. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 93, and/or based on the value of voltage applied to the channel material 38.

The tunneling material 36 forms tunneling regions of the memory cells 60. Such tunneling regions may be configured to allow desired migration (e.g., transportation) of charge (e.g., electrons) between the charge-storage material 30 and the channel material 38. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations. The tunneling material may be bandgap-engineered to achieve desired tunneling properties. For instance, the material 36 may comprise ONO (where ONO may be understood to refer to a laminate comprising $SiO_2/Si_3N_4/SiO_2$).

The charge-blocking material 48 may provide a mechanism to block charge from flowing from the charge-storage material 30 to the associated gates 93.

The dielectric-barrier material (high-k material) 18 may be utilized to inhibit back-tunneling of charge carriers from the gates 93 toward the charge-storage material 30. In some embodiments, the dielectric-barrier material 18 may be considered to form dielectric-barrier regions within the memory cells 60.

In some embodiments, the conductive levels 14 may be considered to have the terminal regions (proximal regions, first regions, control gate regions) 93 proximate the channel material 38, and to have the distal regions (second regions, routing regions, wordline regions) 95 spaced further from the channel material 38 than the terminal regions. The first regions 93 have a first vertical thickness $T_1$, and the second regions 95 have a second vertical thickness $T_2$ (or alternatively, the thickness $T_1$ may be referred to as the second vertical thickness, and the thickness $T_2$ may be referred to as the first vertical thickness). In the shown embodiment of FIG. 14, the first vertical thickness $T_1$ is different from the second vertical thickness $T_2$, and specifically is smaller than the second vertical thickness. In other embodiments, the first vertical thickness $T_1$ may be about the same as the second vertical thickness $T_2$ or may be larger than the second vertical thickness.

Figure 14B:
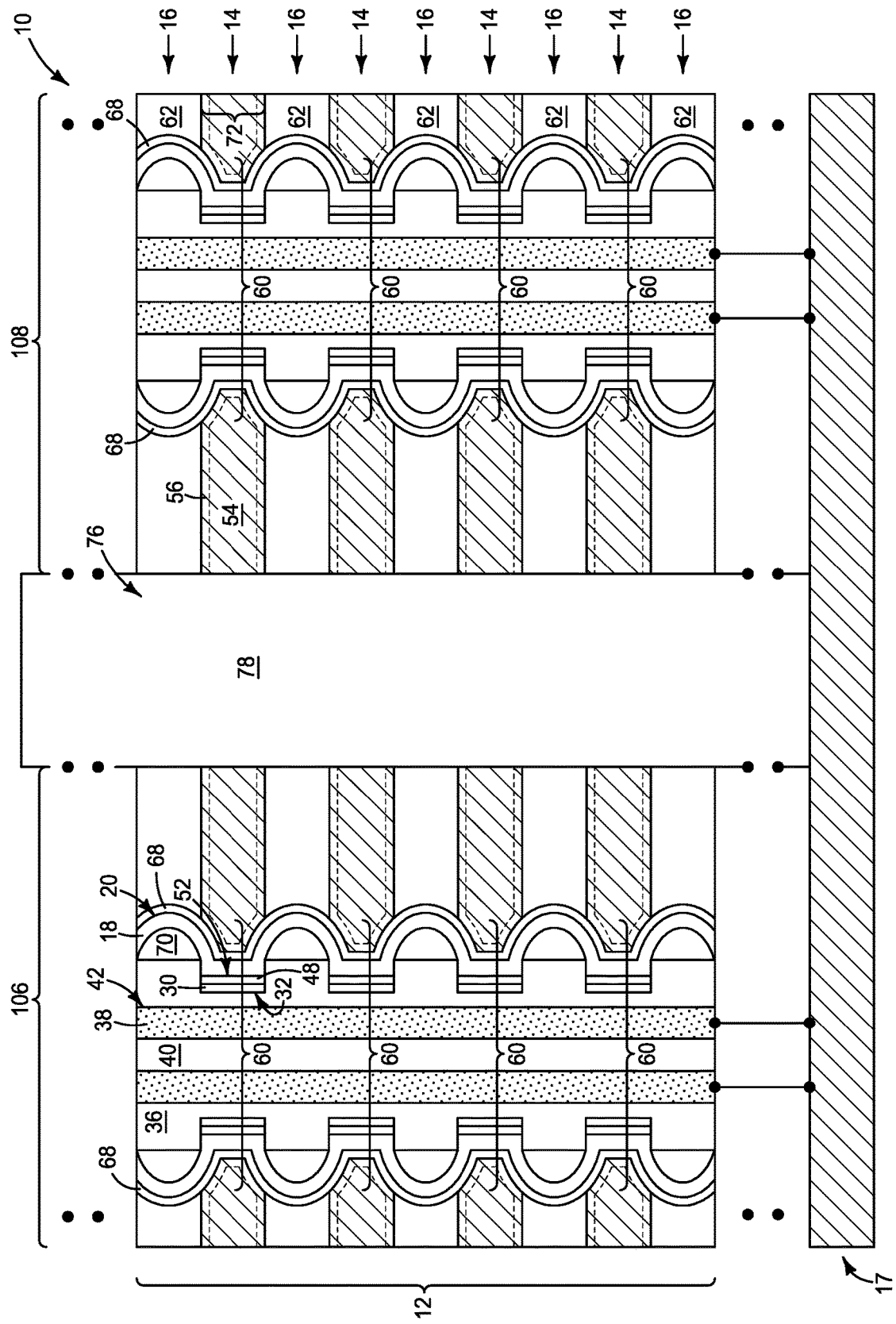
FIGS. 14B-14D are diagrammatic cross-sectional side views of the region of the integrated assembly of FIG. 5 shown at example process stages alternative to the process stage of FIG. 14.

FIG. 14B shows an embodiment similar to that of FIG. 14, but following the process stage of FIG. 7A. Accordingly, the embodiment of FIG. 14B has the protective material (in some embodiments, the oxide-containing-material) 68 directly adjacent to the dielectric-barrier-material 18.

Figure 14C:
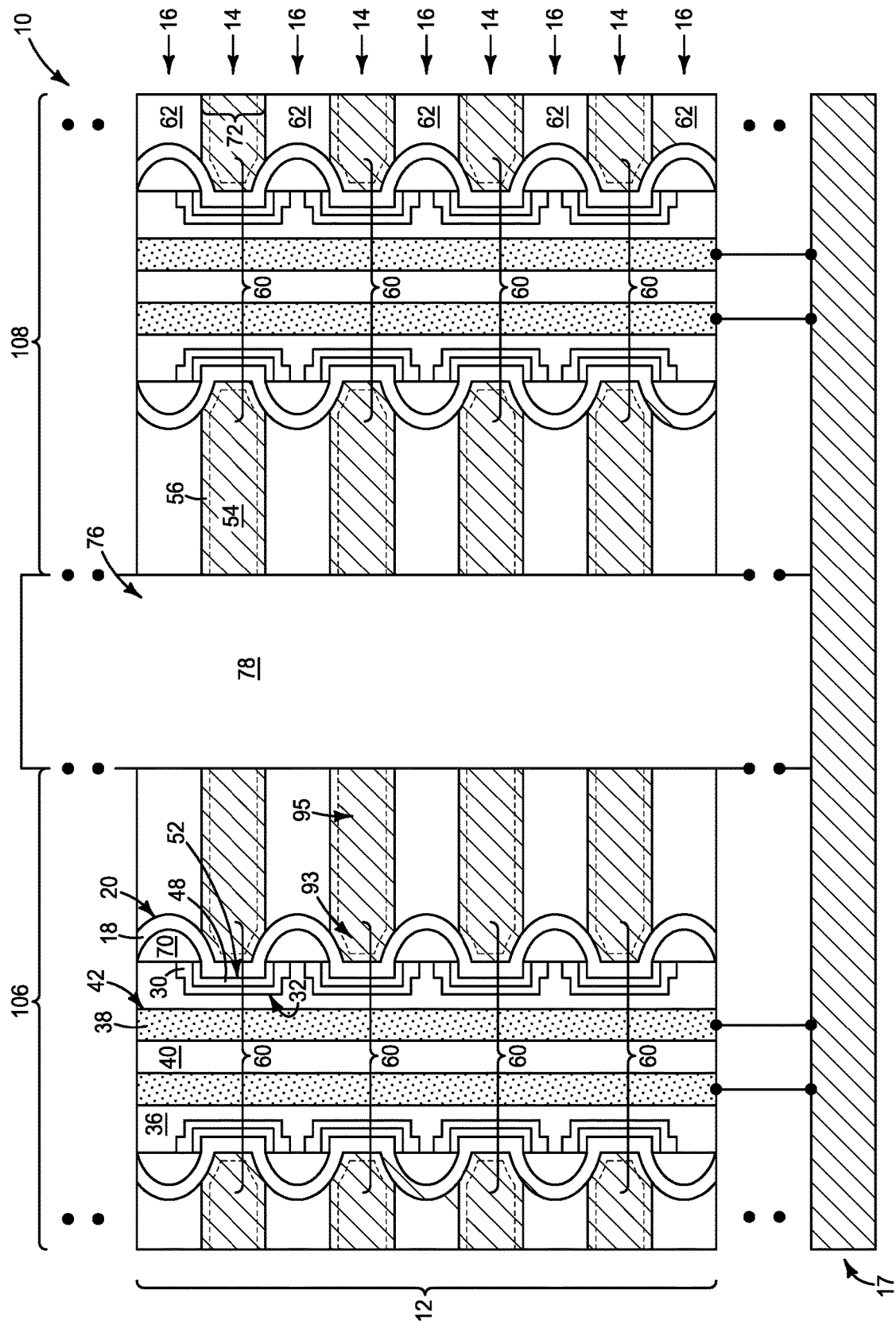

FIG. 14C shows another example embodiment similar to that of FIG. 14. However, whereas the embodiment of FIG. 14 had the charge-storage-material-segments 32 about the same vertical length as the charge-blocking-material-segments 52, the embodiment of FIG. 14C has the of the charge-storage-material-segments 32 vertically longer than the charge-blocking-material-segments 52. The embodiment of FIG. 14C may result from tailoring the conditions utilized to deposit the charge-storage-material 30 at the process stage of FIG. 9 to have such material extend to be vertically longer than is shown in FIG. 9.

Figure 14D:
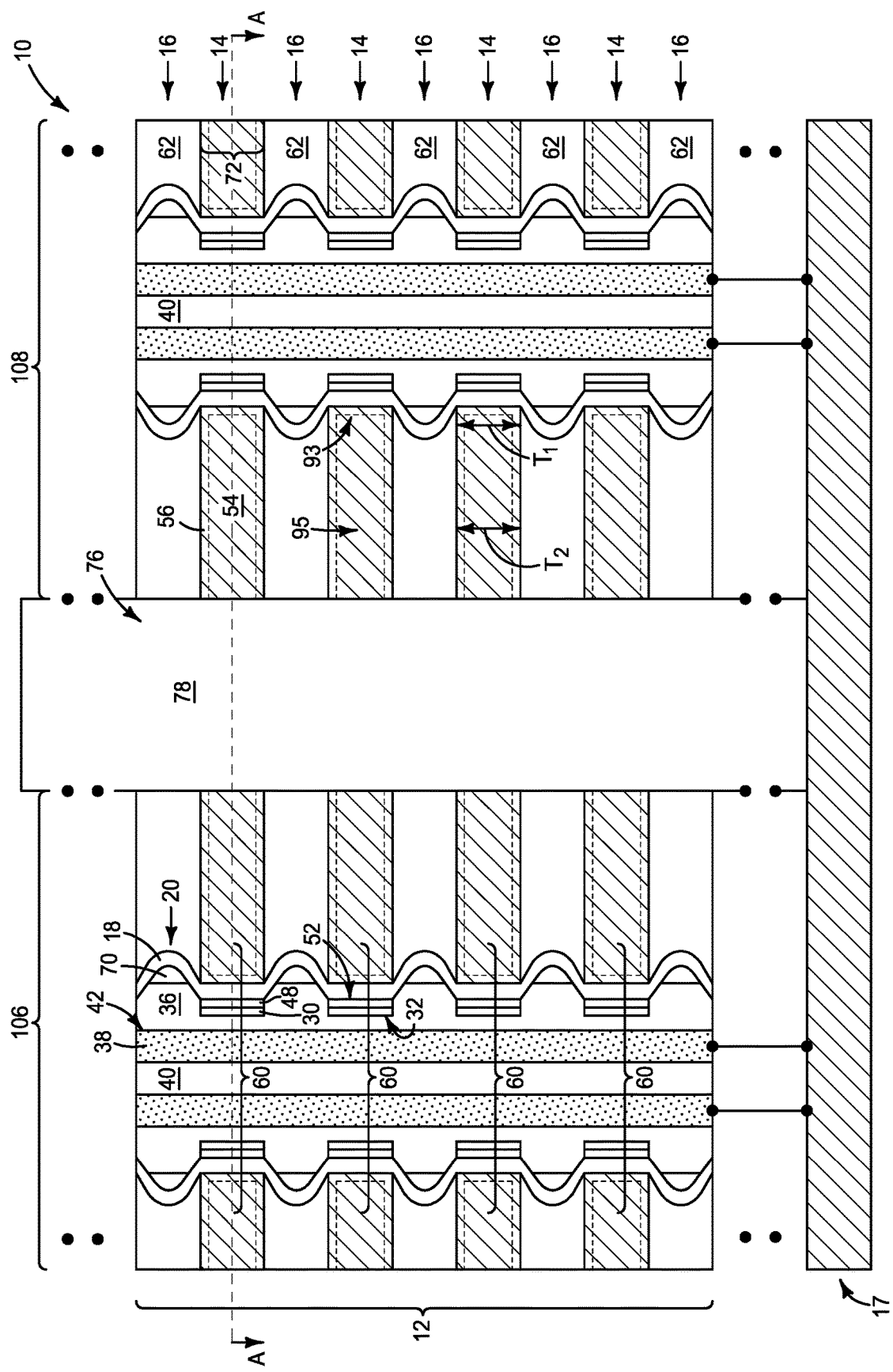

FIG. 14D shows another example embodiment similar to that of FIG. 14. However, whereas the embodiment of FIG. 14 had the thickness $T_1$ of the terminal regions (first regions, control gate regions) 93 less than the thickness $T_2$ of the distal regions (second regions, routing regions) 95 of the conductive levels 14, the embodiment of FIG. 14D has the thicknesses $T_1$ and $T_2$ substantially equal to one another. Such may be accomplished by, for example, tailoring the lateral thicknesses and overall shapes of the ribbons 20 of the high-k-dielectric-material 18, and/or tailoring the vertical thicknesses of the levels 14, and/or tailoring the vertical thicknesses of the levels 16. It may be advantageous for the control gate regions to have vertical thicknesses which are relatively large as compared to the vertical thicknesses of the charge-storage-material-segments 32 to enable rapid, robust control of reading/writing operations associated with the memory cells 60. Another way of expressing the desire for the large vertical length $T_1$ is to state that it may be desirable for the control gate regions 93 to have large operable gate widths with substantial vertical overlap across the charge-storage-material-segments 32.

Figure 15:
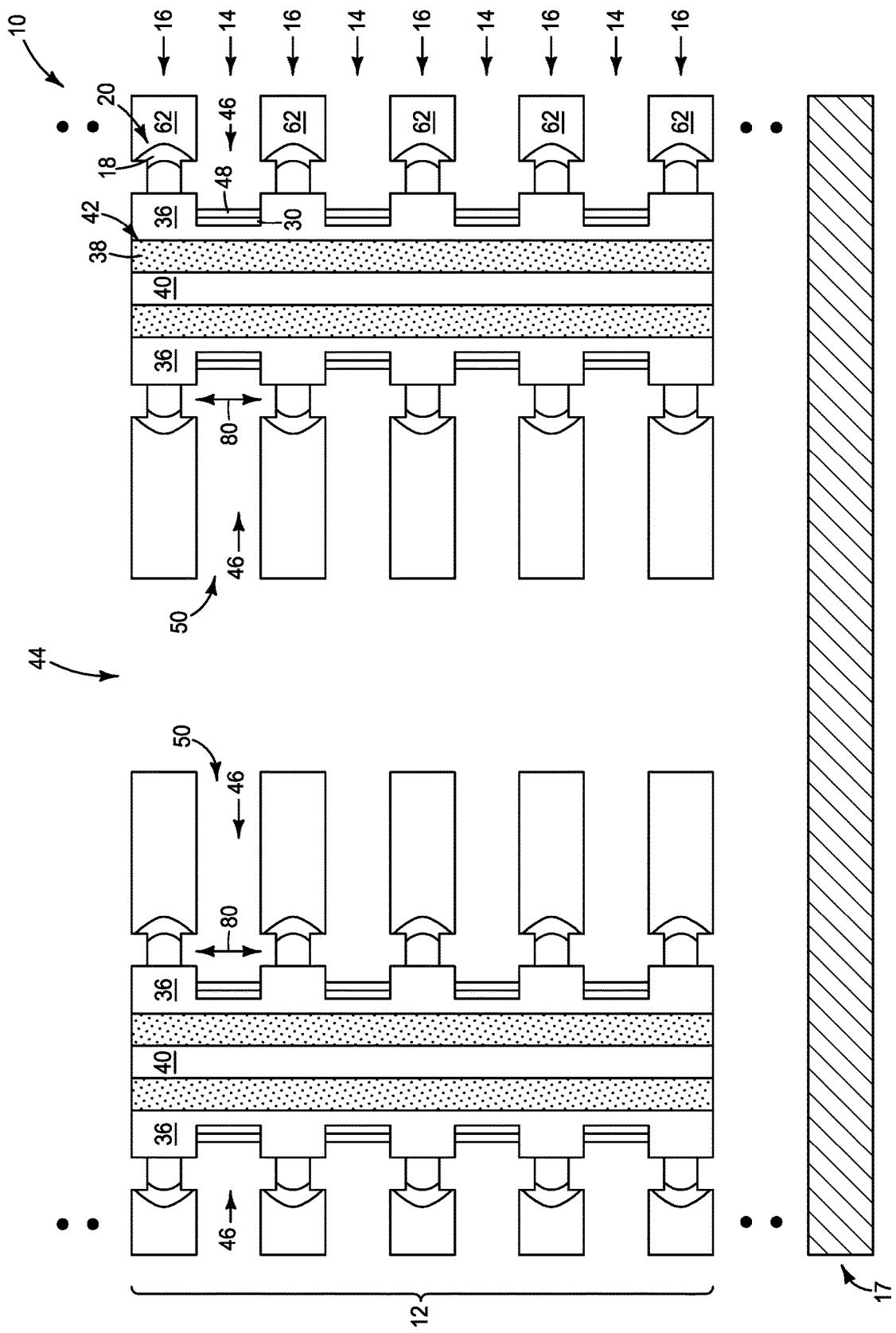
FIGS. 15 and 16 are diagrammatic cross-sectional side views of the region of the integrated assembly of FIG. 5 shown at example sequential process stages which may follow the process stage of FIG. 11.
Figure 16:
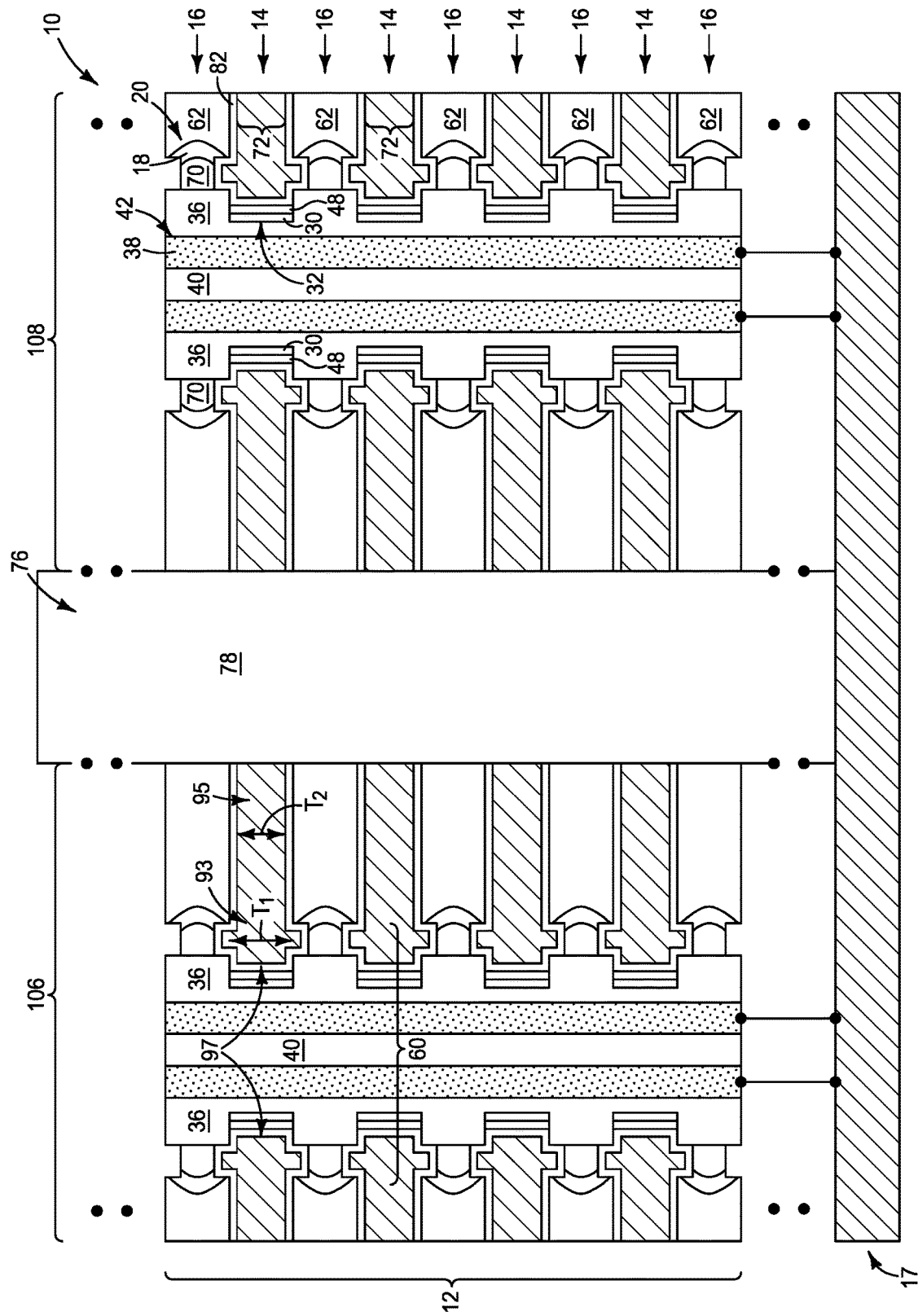

FIGS. 15 and 16 describe processing which may enable the vertical thickness $T_1$ (the operable gate width) of the control gate region 93 to be made very large. FIG. 15 shows the assembly 10 at a process stage which may follow the process stage of FIG. 11. The conduits (voids) 46 are formed analogously to the embodiment of FIG. 12, but such conduits are extended through the material 18. Thus, the substance 50 may be flowed directly against the charge-storage-material 30 to form the charge-blocking-material 48, rather than being flowed through the material 18. The extension of the conduits 46 through the material 18 also creates widened regions 80 of the voids 46.

Referring to FIG. 16, the voids 46 (FIG. 15) are lined with dielectric-barrier-material 82, and then the conductive material 72 is formed within the lined voids. The conductive material 72 may comprise any suitable composition(s), and in some embodiments may comprise the conductive-core-material and conductive-liner-material discussed above with reference to FIG. 13.

The dielectric-barrier-material 82 may be high-k-dielectric-material, and may, for example, comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries. The high-k-dielectric-material 82 may be formed to any suitable thickness; and in some embodiments may be formed to a thickness within a range of from about 1 nm to about 5 nm. The material 82 may or may not comprise a same composition as the high-k-material 18 of the ribbons 20.

The panel 76 is formed within the slit 44 (FIG. 15).

The assembly 10 of FIG. 16 comprises control gate regions 93 and routing regions 95 analogous to those of FIG. 14, but has the control gate regions with vertical thicknesses $T_1$ larger than the vertical thicknesses $T_2$ of the routing regions. In the shown embodiment, the vertically-widest portions of the control gate regions are inset from the absolute terminal ends 97 of the control gate regions. In other embodiments, the processing of FIG. 15 may be tailored so that the vertically-widest portions of the control gate regions overlap the absolute terminal ends of the control gate regions.

The control gate regions of FIG. 16 may be considered to have hammerhead configurations.

The portions of the ribbons 20 (the high-k-material 18) remaining within the insulative levels 16 at the process stage of FIG. 16 may be advantageous as they may enable the dielectric properties of regions of the levels 16 to be tailored for particular applications.

The embodiments described herein advantageously provide methodology which may be utilized to tailor the gate lengths of the control gates 93 (i.e., the vertical thicknesses $T_1$ of the control gates 93). In some embodiments, such gate lengths may be equal to or greater than the lengths of the storage nodes (i.e., the vertical lengths of the segments 32 of the charge-storage-material 30) within the memory cells 60. Such may enable desired wide program/erase windows associated with the memory cells. Further, the routing regions (wordline regions) 95 may be kept relatively narrow (as compared to the control gates), which may alleviate undesired parasitic capacitance between vertically-adjacent routing regions.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a stack of alternating insulative levels and conductive levels. A pillar of channel material extends through the stack. The conductive levels have terminal regions adjacent the pillar and laterally offset from the pillar. Charge-storage-material-segments are adjacent the conductive levels of the stack, and are between the channel material and the terminal regions. Vertically-neighboring charge-storage-material-segments are spaced from one another by intervening regions aligned with the insulative levels. Tunneling material is between the charge-storage-material-segments and the channel material. Charge-blocking-material is between the charge-storage-material-segments and the terminal regions. Ribbons of dielectric material extend vertically across the insulative levels and are laterally inset relative to the terminal regions. The ribbons have first regions adjacent the conductive levels and have second regions between the first regions. The second regions are laterally inset relative to the first regions such that innermost surfaces of the ribbons have convex configurations.

Some embodiments include an integrated assembly comprising a stack of alternating insulative levels and conductive levels. Pillars of channel material extend through the stack. Charge-storage-material-segments are adjacent the conductive levels of the stack, and are between the channel material and terminal regions of the conductive levels. Tunneling material is between the charge-storage-material-segments and the channel material. Charge-blocking-material-segments are directly against the charge-storage-material-segments, and are between the charge-storage-material-segments and the terminal regions. High-k-dielectric-material-structures extend vertically across the conductive levels and the insulative levels. First portions of the high-k-dielectric-material-structures are along the conductive levels, and second portions of the high-k-dielectric-material-structures are along the insulative levels. The second portions are laterally inset relative to the terminal regions. The first portions are laterally outward of the terminal regions and are between the terminal regions and the charge-blocking-material.

Some embodiments include a method of forming an integrated assembly. A vertical stack of alternating first and second levels is formed. The first levels comprise first material, and the second levels comprise second material. An opening is formed to extend through the stack. The opening has a sidewall which extends across the first and second levels. The second levels are recessed relative to the first levels along the sidewall. The first levels have projecting terminal ends which extend beyond the recessed second levels. Cavities are along the recessed second levels and are vertically between the projecting terminal ends. Third material is formed to extend around the projecting terminal ends and within the cavities. The third material narrows the cavities. Fourth material is formed within the narrowed cavities. Charge-storage-material is selectively formed along the third material relative to the fourth material to thereby form segments of the charge-storage-material adjacent the projecting terminal ends of the first levels. Tunneling material is formed within the opening and adjacent the charge-storage-material. Channel material is formed within the opening and adjacent the tunneling material. The first material of the first levels is removed to leave voids. A first portion of the charge-storage-material is modified with a substance flowed into the voids while a second portion of the charge-storage-material is left unmodified. The modifying converts the charge-storage-material of said first portion into charge-blocking-material. Conductive material is formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a stack of alternating insulative levels and conductive levels;
   a pillar of channel material extending through the stack, the conductive levels having terminal regions adjacent the pillar and laterally offset from the pillar;
   charge-storage-material-segments adjacent the conductive levels of the stack, and being between the channel material and the terminal regions; vertically-neighboring charge-storage-material-segments being spaced from one another by intervening regions aligned with the insulative levels;
   tunneling material between the charge-storage-material-segments and the channel material;
   charge-blocking-material between the charge-storage-material-segments and the terminal regions; and
   ribbons of dielectric material extending vertically across the insulative levels and being laterally inset relative to the terminal regions; the ribbons having first regions adjacent the conductive levels and having second regions between the first regions; the second regions being laterally inset relative to the first regions such that innermost surfaces of the ribbons have convex configurations.

2. The integrated assembly of claim 1 wherein the dielectric material of said ribbons is high-k material.

3. The integrated assembly of claim 2 wherein the high-k material comprises one or more of AlO, HfO, HfSiO, ZrO and ZrSiO, where the chemical formulas indicate primary constituents rather than specific stoichiometries.

4. The integrated assembly of claim 1 wherein the charge-storage-material comprises silicon nitride.

5. The integrated assembly of claim 1 wherein the charge-blocking-material comprises silicon, oxygen and nitrogen.

6. The integrated assembly of claim 1 wherein the charge-blocking-material comprises silicon dioxide.

7. The integrated assembly of claim 1 wherein the dielectric material is between the charge-blocking-material and the terminal regions of the conductive levels.

8. The integrated assembly of claim 1 wherein the charge-blocking-material is configured as charge-blocking-material-segments adjacent the conductive levels of the stack, with vertically-neighboring charge-blocking-material-segments being spaced from one another by the intervening regions.

9. The integrated assembly of claim 8 wherein the charge-storage-material-segments are about a same vertical length as the charge-blocking-material-segments.

10. The integrated assembly of claim 8 wherein the charge-storage-material-segments are vertically longer than the charge-blocking-material-segments.

11. The integrated assembly of claim 1 wherein the pillar of the channel material has a hollow configuration.

12. The integrated assembly of claim 1 wherein the conductive levels have first regions of a first vertical thickness and have the terminal regions of a second vertical thickness which is different than the first vertical thickness.

13. The integrated assembly of claim 12 wherein the second thickness is less than the first thickness.

14. The integrated assembly of claim 12 wherein the second thickness is greater than the first thickness.

15. The integrated assembly of claim 1 wherein the conductive levels include a conductive-liner-material extending along an outer peripheral surface of a conductive-core-material.

16. The integrated assembly of claim 15 wherein the conductive-liner-material comprises titanium nitride and the conductive-core-material comprises tungsten.

17. The integrated assembly of claim 16 further comprising dielectric-barrier-material along an outer periphery of the conductive-liner-material, with the dielectric-barrier-material comprising a different composition than the dielectric material of said ribbons.

18. An integrated assembly, comprising:
 a stack of alternating insulative levels and conductive levels;
 pillars of channel material extending through the stack;
 charge-storage-material-segments adjacent the conductive levels of the stack, and being between the channel material and terminal regions of the conductive levels;
 tunneling material between the charge-storage-material-segments and the channel material;
 charge-blocking-material-segments directly against the charge-storage-material-segments, and being between the charge-storage-material-segments and the terminal regions; and
 high-k-dielectric-material-structures extending vertically across the conductive levels and the insulative levels; first portions of the high-k-dielectric-material-structures being along the conductive levels, and second portions of the high-k-dielectric-material-structures being along the insulative levels; the second portions being laterally inset relative to the terminal regions; the first portions being laterally outward of the terminal regions and being between the terminal regions and the charge-blocking-material.

19. The integrated assembly of claim 18 comprising intervening material between the first portions of the high-k-dielectric-material-structures and the terminal regions.

20. The integrated assembly of claim 19 wherein the intervening material comprises one or more oxides.

21. The integrated assembly of claim 18 wherein the second portions of the high-k-dielectric-material-structures have first regions adjacent the conductive levels and have second regions between the first regions, with the second regions being laterally inset relative to the first regions.

22. The integrated assembly of claim 21 wherein the high-k-dielectric-material-structures have first surfaces facing the terminal regions and have second surfaces in opposing relation to the first surfaces, and comprising oxide-containing material along the first surfaces of the second portions and not along first surfaces of the first portions.

23. The integrated assembly of claim 18 wherein the terminal regions include control gate regions of memory cells; wherein the conductive levels have wordline regions of a first vertical thickness and extending laterally from the control gate regions; and wherein the control gate regions have a second vertical thickness which is about the same as the first vertical thickness.

24. The integrated assembly of claim 18 wherein the terminal regions include control gate regions of memory cells; wherein the conductive levels have wordline regions of a first vertical thickness and extending laterally from the control gate regions; and wherein the control gate regions have a second vertical thickness which is different than the first vertical thickness.

25. The integrated assembly of claim 24 wherein the second thickness is less than the first thickness.

26. The integrated assembly of claim 24 wherein the second thickness is greater than the first thickness.

27. The integrated assembly of claim 18 wherein the charge-storage-material-segments comprise a vertical length that is substantially the same as a vertical length of the charge-blocking-material-segments.

28. The integrated assembly of claim 18 wherein the second portions of the high-k-dielectric-material-structures comprises a curved structure.

29. The integrated assembly of claim 18 wherein the conductive levels comprise a maximum vertical length that is substantially the same as a vertical length of the charge-storage-material-segments.

30. A method of forming an integrated assembly, comprising:
 forming a vertical stack of alternating first and second levels; the first levels comprising first material, and the second levels comprising second material;
 forming an opening to extend through the stack, the opening having a sidewall extending across the first and second levels;
 recessing the second levels relative to the first levels along the sidewall; the first levels having projecting terminal ends extending beyond the recessed second levels; cavities being along the recessed second levels and vertically between the projecting terminal ends;
 forming third material to extend around the projecting terminal ends and within the cavities, the third material narrowing the cavities;
 forming fourth material within the narrowed cavities;
 selectively forming charge-storage-material along the third material relative to the fourth material to thereby form segments of the charge-storage-material adjacent the projecting terminal ends of the first levels;
 forming tunneling material within the opening and adjacent the charge-storage-material;
 forming channel material within the opening and adjacent the tunneling material;
 removing the first material of the first levels to leave voids;
 modifying a first portion of the charge-storage-material with a substance flowed into the voids while leaving a second portion of the charge-storage-material unmodified; the modifying converting the charge-storage-material of said first portion into charge-blocking-material; and
 forming conductive material within the voids.

31. The method of claim 30 wherein the modifying of the first portion of the charge-storage-material comprises oxidation of the first portion of the charge-storage-material, and wherein the substance comprises oxidant.

32. The method of claim 31 wherein the charge-storage-material comprises silicon nitride, and wherein the charge-blocking-material comprises silicon, oxygen and nitrogen.

33. The method of claim 31 wherein the charge-storage-material comprises silicon nitride, and wherein the charge-blocking-material comprises silicon dioxide.

34. The method of claim 30 wherein the conductive material within the voids forms conductive levels; wherein the conductive levels have first regions of a first vertical thickness, and have second regions of a second vertical thickness which is greater than the first vertical thickness; and wherein the second regions are between the first regions and the charge-blocking material.

35. The method of claim 30 further comprising forming high-k material within the voids to line the voids prior to forming the conductive material within the voids.

36. The method of claim 30 wherein the conductive material includes a conductive-core-material, and includes a conductive-liner-material which at least partially surrounds an outer periphery of the conductive-core-material.

37. The method of claim 30 wherein the first material comprises silicon nitride and the second material comprises silicon dioxide.

38. The method of claim 30 wherein the third material comprises high-k dielectric material.

39. The method of claim 38 comprising flowing the substance through the third material during the modifying of the first portion of the charge-storage-material.

40. The method of claim 38 comprising extending the voids through the third material to expose the first portion of the charge-storage-material prior to the modifying of the first portion of the charge-storage-material.

41. The method of claim 30 wherein the fourth material comprises silicon dioxide.

42. The method of claim 30 comprising forming a protective-liner-material along the sidewalls of the opening prior to forming the third material.

43. The method of claim 42 comprising extending the voids through the protective-liner-material prior to the modifying of the first portion of the charge-storage-material.

44. The method of claim 30 wherein the forming of the fourth material comprises forming the fourth material within only the narrowed cavities.

45. The method of claim 30 wherein the segment of the charge-storage-material comprise a vertical length that is substantially the same as a vertical length of the charge-blocking-material.

46. The method of claim 30 wherein the third material within the cavities comprises a curved structure.

47. The method of claim 30 wherein the conductive material comprises a maximum vertical length that is substantially the same as a vertical length of the segments of the charge-storage-material.

* * * * *